US012593558B2

(12) United States Patent
Park et al.

(10) Patent No.: US 12,593,558 B2
(45) Date of Patent: Mar. 31, 2026

(54) DISPLAY DEVICE AND METHOD OF MANUFACTURING THE SAME

(71) Applicant: Samsung Display Co., LTD., Yongin-si (KR)

(72) Inventors: Jeong Su Park, Yongin-si (KR); Jun Seok Min, Yongin-si (KR); Sung Jin Lee, Yongin-si (KR); Jong Chan Lee, Yongin-si (KR); Woong Hee Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 410 days.

(21) Appl. No.: 18/104,467

(22) Filed: Feb. 1, 2023

(65) Prior Publication Data

US 2024/0006558 A1 Jan. 4, 2024

(30) Foreign Application Priority Data

Jun. 30, 2022 (KR) ........................ 10-2022-0080700

(51) Int. Cl.
*H10H 29/37* (2025.01)
*H01L 25/075* (2006.01)
*H01L 25/16* (2023.01)
*H10H 29/01* (2025.01)
*H10H 29/03* (2025.01)

(52) U.S. Cl.
CPC ......... *H10H 29/37* (2025.01); *H01L 25/0753* (2013.01); *H10H 29/012* (2025.01); *H10H 29/03* (2025.01); *H01L 25/167* (2013.01)

(58) Field of Classification Search
CPC .... H01L 25/0753; H01L 25/167; H10H 29/37
See application file for complete search history.

(56) References Cited

U.S. PATENT DOCUMENTS

| | | |
|---|---|---|
| 9,653,518 B2 | 5/2017 | Kim |
| 2021/0159250 A1 | 5/2021 | Chang et al. |
| 2022/0223575 A1* | 7/2022 | Kim ..................... H10H 20/855 |

FOREIGN PATENT DOCUMENTS

| | | | |
|---|---|---|---|
| KR | 10-2016-0119351 | 10/2016 | |
| KR | 10-2021-0065238 | 6/2021 | |
| WO | WO-2020197080 A1 * | 10/2020 | ............. H10D 86/40 |

* cited by examiner

*Primary Examiner* — Brent A. Fairbanks
*Assistant Examiner* — Molly K Reida
(74) *Attorney, Agent, or Firm* — Womble Bond Dickinson (US) LLP

(57) ABSTRACT

A display device includes a first electrode and a second electrode disposed on a substrate; a first insulating layer disposed over the first electrode and the second electrode; a first bank and a second bank disposed on the first insulating layer and spaced apart from each other; and a light emitting element disposed between the first bank and the second bank. A top surface of the first bank may include a concave groove including a dam structure protruding in a first direction.

11 Claims, 18 Drawing Sheets

ALE: ALE1, ALE2, ALE3
ELT: ELT1, ELT2
ELT1: ELT1_1, ELT1_2
BNK: BNK1, BNK2

ALE: ALE1, ALE2, ALE3
ELT: ELT1, ELT2
ELT1: ELT1_1, ELT1_2

FIG. 7

ALE: ALE1, ALE2, ALE3
ELT: ELT1, ELT2
ELT1: ELT1_1, ELT1_2
BNK: BNK1, BNK2

DR1

PXL: PXL1, PXL2, PXL3
CCL: CCL1, CCL2, LSL
CFL: CF1, CF2, CF3

FIG. 11

ALE: ALE1, ALE2, ALE3
ELT: ELT1, ELT2
ELT1: ELT1_1, ELT1_2
BNK: BNK1, BNK2

FIG. 12

INS1
VIA
PSV
ILD
BFL
BSL

ALE1

ALE2

ALE3

PCL

A

A'

ALE: ALE1, ALE2, ALE3

INS1
VIA
PSV
ILD
BFL
BSL

BNK1'
BNK2
BNK1'

ALE3
ALE2
ALE1

A
A'

PCL

ALE: ALE1, ALE2, ALE3
BNK: BNK1', BNK2

ALE: ALE1, ALE2, ALE3
BNK: BNK1', BNK2

FIG. 15A

ALE: ALE1, ALE2, ALE3
BNK: BNK1, BNK2

FIG. 15B

ALE: ALE1, ALE2, ALE3
BNK: BNK1, BNK2

FIG. 17

ALE: ALE1, ALE2, ALE3
BNK: BNK1, BNK2

DISPLAY DEVICE AND METHOD OF MANUFACTURING THE SAME

CROSS-REFERENCE TO RELATED APPLICATION

This application claims priority to and benefits of Korean patent application No. 10-2022-0080700 under 35 U.S.C. § 119, filed on Jun. 30, 2022 in the Korean Intellectual Property Office (KIPO), the entire disclosure of which is incorporated herein by reference.

BACKGROUND

1. Technical Field

The disclosure generally relates to a display device and a method of manufacturing the same.

2. Related Art

Recently, as interest in information displays is increased, research and development of display devices have been continuously conducted.

SUMMARY

Embodiments provide a display device including a concave groove formed on a bank defining an emission area and a non-emission area and a dam structure disposed in the concave groove.

Embodiments also provide a method of manufacturing a display device including a bank in which a concave groove and a dam structure are formed.

In accordance with an aspect of the present disclosure, there is provided a display device including a first electrode and a second electrode disposed on a substrate; a first insulating layer disposed over the first electrode and the second electrode; a first bank and a second bank disposed on the first insulating layer and spaced apart from each other; and a light emitting element disposed between the first bank and the second bank, wherein a top surface of the first bank includes a concave groove including a dam structure protruding in a first direction.

The display device may further include a second insulating layer disposed on an outer sidewall of the first bank and the second bank.

In a plan view, the concave groove and the second insulating layer may not overlap with each other.

An insulating material may be disposed on a top surface of the dam structure.

The insulating material and the second insulating layer may include a same material.

The insulating material and the second insulating layer may have a hydrophilic surface characteristic. The concave groove of the first bank may have a hydrophobic surface characteristic.

The dam structure may be disposed on a flat surface surrounded by an inner sidewall of the concave groove of the first bank.

A height of the dam structure from the flat surface may be equal to or smaller than a depth of the concave groove.

The flat surface of the concave groove may include a first concave groove and a second concave groove, the first concave groove and the second concave groove may be spaced apart from each other in a second direction with the dam structure interposed therebetween. A width of each of the first concave groove and the second concave groove in the second direction may be longer than a width of the dam structure in the second direction.

A width of the first bank in the second direction may be longer than a width of the second bank in the second direction.

The second bank may be disposed between the first bank and an adjacent first bank.

In accordance with another aspect of the present disclosure, there is provided a method of manufacturing a display device, the method including disposing a first electrode and a second electrode on a substrate; disposing a first insulating layer over the first electrode and the second electrode; forming a first bank and a second bank, which define an emission area and a non-emission area, on the first insulating layer; disposing a second insulating layer on the first bank and the second bank; forming a concave groove exposing the first bank and a dam structure on the concave groove by removing a portion of each of the first bank and the second insulating layer with a mask; and aligning light emitting elements in the emission area.

The mask may include a first area having a first light transmittance and a second area having a second light transmittance smaller than the first light transmittance.

A first concave groove and a second concave groove of the concave groove may be formed in an area corresponding to the first area, and the dam structure between the first concave groove and the second concave groove may be formed in an area corresponding to the second area.

The first concave groove and the second concave groove may be symmetrical to each other with respect to the dam structure.

A height of the dam structure may be differently formed according to the second light transmittance.

The second insulating layer may be disposed on a top surface of the dam structure.

The second insulating layer may have a hydrophilic surface characteristic. The concave groove of the first bank may have a hydrophobic surface characteristic.

In a plan view, the concave groove and the second insulating layer may not overlap with each other.

The forming of the first bank and the second bank includes disposing the second bank between the first bank and an adjacent first bank.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be more thorough and complete, and will convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 7 is a schematic sectional view illustrating an example taken along line A-A' shown in FIG. 5.

FIG. 11 is a schematic sectional view illustrating another example taken along line A-A' shown in FIG. 5.

FIGS. 12 to 17 are schematic sectional views illustrating a method of manufacturing the display device in accordance with embodiments of the present disclosure.

DETAILED DESCRIPTION OF THE EMBODIMENTS

Figure 1:
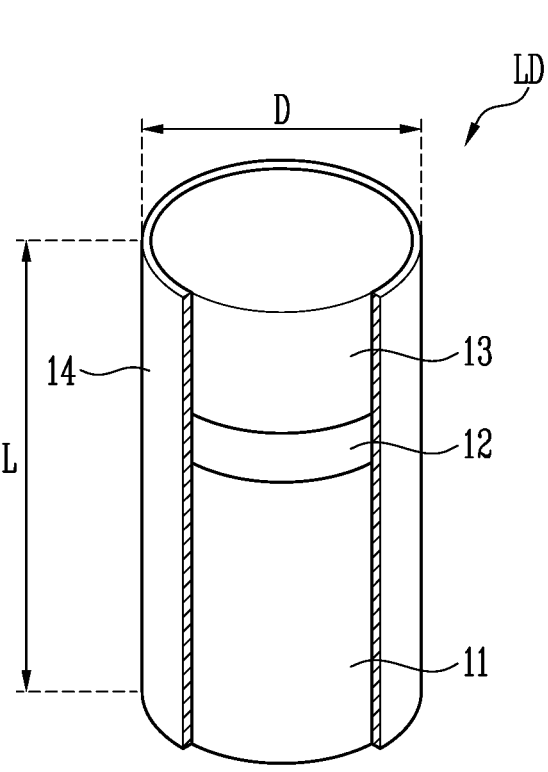
FIG. 1 is a schematic perspective view illustrating a light emitting element in accordance with embodiments of the present disclosure.

Hereinafter, embodiments of the disclosure will be described in more detail with reference to the accompanying drawings. Throughout the drawings, the same reference numerals are given to the same elements, and their overlapping descriptions will be omitted.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The term "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
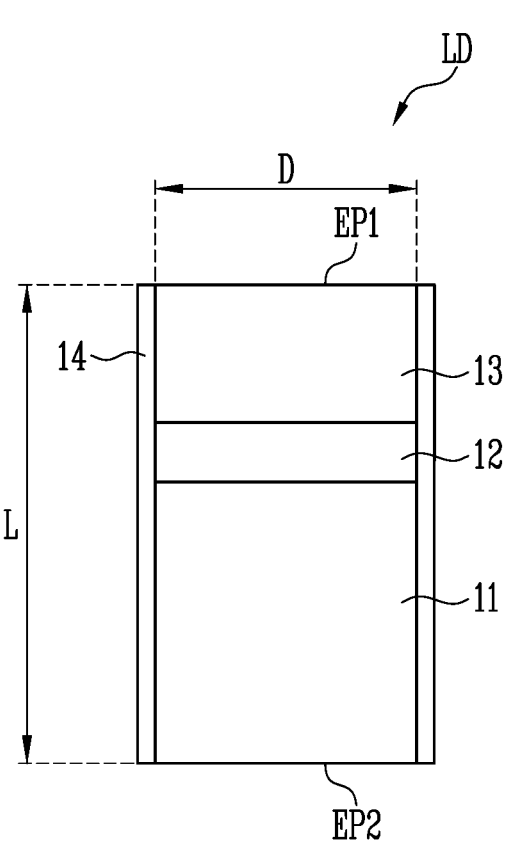
FIG. 2 is a schematic sectional view illustrating an example of the light emitting element shown in FIG. 1.

FIG. 1 is a perspective view schematically illustrating a light emitting element in accordance with embodiments of the disclosure. FIG. 2 is a sectional view illustrating an example of the light emitting element shown in FIG. 1.

Referring to FIGS. 1 and 2, a light emitting element LD may include a first semiconductor layer 11, a second semiconductor layer 13, and an active layer 12 interposed between the first and second semiconductor layers 11 and 13. In an example, the light emitting element LD may be implemented with a light emitting stack structure (or stack pattern) in which the first semiconductor layer 11, the active layer 12, and the second semiconductor layer 13 are sequentially stacked each other.

In an embodiment, the light emitting element LD may be provided in a shape extending in a direction. When assuming that an extending direction of the light emitting element LD is a length direction, the light emitting element LD may include a first end portion EP1 and a second end portion EP2 in the length direction. A semiconductor layer selected from the first semiconductor layer 11 and the second semiconductor layer 13 may be located at the first end portion EP1 of the light emitting element LD, and the other semiconductor layer selected from the first semiconductor layer 11 and the second semiconductor layer 13 may be located at the second end portion EP2 of the light emitting element LD.

In an embodiment, the light emitting element LD may be provided in various shapes. In an example, the light emitting element LD may have a rod-like shape, a bar-like shape, a pillar-like shape, or the like, which is long in its length direction (e.g., its aspect ratio is greater than about 1) as shown in FIG. 1. In another example, the light emitting element LD may have a rod-like shape, a bar-like shape, a pillar-like shape, or the like, which is short in its length direction (e.g., its aspect ratio is smaller than about 1). In still another example, the light emitting element LD may have a rod-like shape, a bar-like shape, a pillar-like shape, or the like, of which the aspect ratio is about 1.

The light emitting element LD may include, for example, a light emitting diode (LED) manufactured small enough to have a diameter D and/or a length L to a degree of a nano scale (or nanometers) to a micro scale (micrometers).

In an embodiment, in case that the light emitting element LD is long in its length direction (e.g., its aspect ratio is greater than about 1), the diameter D of the light emitting element LD may be about 0.5 $\mu$m to about 6 $\mu$m, and the length L of the light emitting element LD may be about 1 $\mu$m to about 10 $\mu$m. However, the diameter D and the length L of the light emitting element LD are not limited thereto, and the size of the light emitting element LD may be changed to accord with requirement conditions (or design conditions) of a lighting device or a self-luminous display device, to which the light emitting element LD is applied.

In an embodiment, the first semiconductor layer 11 may include, for example, at least one n-type semiconductor layer. The first semiconductor layer 11 may include an upper surface contacting the active layer 12 and a lower surface exposed to the outside in the length direction of the light emitting element LD. The lower surface of the first semiconductor layer 11 may be an end portion (or bottom end portion) of the light emitting element LD.

In an embodiment, the active layer 12 is formed on the first semiconductor layer 11, and may be formed in a single or multiple quantum well structure. In an example, in case that the active layer 12 is formed in the multiple quantum well structure, a barrier layer, a strain reinforcing layer, and a well layer, which constitute (or form) one unit, may be periodically and repeatedly stacked each other in the active layer 12. The strain reinforcing layer may have a lattice constant smaller than that of the barrier layer, to further reinforce strain, e.g., compressive strain applied to the well layer. However, the structure of the active layer 12 is not limited to the above-described embodiment.

In an embodiment, the active layer 12 may emit light having a wavelength of about 400 nm to about 900 nm, and use a double heterostructure. The active layer 12 may include a first surface contacting the first semiconductor layer 11 and a second surface contacting the second semiconductor layer 13.

In an embodiment, a color (or light output color) of the light emitting element LD may be determined according to a wavelength of light emitted from the active layer 12. The color of the light emitting element LD may determine a color of a pixel corresponding thereto. For example, the light emitting element LD may emit red light, green light, or blue light.

In an embodiment, in case that an electric field having a voltage or more (e.g., a predetermined or selectable voltage or more) is applied to the end portions of the light emitting element LD, the light emitting element LD emits light as electron-hole pairs are combined in the active layer 12. The light emission of the light emitting element LD is controlled by using such a principle, so that the light emitting element LD can be used as a light source (or light emitting source) for various light emitting devices, including a pixel of a display device.

In an embodiment, the second semiconductor layer 13 is formed on the second surface of the active layer 12, and may include a semiconductor layer having a type different from that of the first semiconductor layer 11. For example, the second semiconductor layer 13 may include at least one p-type semiconductor layer.

In an embodiment, the second semiconductor layer 13 may include a lower surface contacting the second surface of the active layer 12 and an upper surface exposed to the outside in the length direction of the light emitting element LD. The upper surface of the second semiconductor layer 13 may be another end portion (or top end portion) of the light emitting element LD.

In an embodiment, the first semiconductor layer 11 and the second semiconductor layer 13 may have different thicknesses in the length direction of the light emitting element LD. In an example, the first semiconductor layer 11 may have a thickness relatively thicker than that of the second semiconductor layer 13 in the length direction of the light emitting element LD. Accordingly, the active layer 12 of the light emitting element LD may be located more adjacent to the upper surface of the second semiconductor layer 13 than the lower surface of the first semiconductor layer 11.

In an embodiment, although it is illustrated that each of the first semiconductor layer 11 and the second semiconductor layer 13 is configured with one layer, the disclosure is not limited thereto. In an embodiment, each of the first semiconductor layer 11 and the second semiconductor layer 13 may further include at least one layer, e.g., a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR layer may be configured with a p-type semiconductor layer such as p-GAInP, p-AlInP or p-Al-GaInP, but the disclosure is not limited thereto.

In an embodiment, the light emitting element LD may further include a contact electrode (hereinafter, referred to as a "first contact electrode") disposed on the top of the second semiconductor layer 13, in addition to the first semiconductor layer 11, the active layer 12, and the second semiconductor layer 13, which are described above. In other embodiments, the light emitting element LD may further include another contact electrode (hereinafter, referred to as a "second contact electrode") disposed at an end of the first semiconductor layer 11.

In an embodiment, each of the first and second contact electrodes may be an ohmic contact electrode, but the disclosure is not limited thereto. In some embodiments, each of the first and second contact electrodes may be a Schottky contact electrode. The first and second contact electrodes may include a conductive material.

In an embodiment, the light emitting element LD may further include an insulative film 14 (or insulating film). However, in some embodiments, the insulative film 14 may be omitted or may be provided to cover (or overlap) only portions of the first semiconductor layer 11, the active layer 12, and the second semiconductor layer 13.

In an embodiment, the insulative film 14 can prevent an electrical short circuit which may occur in case that the active layer 12 contacts a conductive material in addition to the first semiconductor layer 11 and the second semiconductor layer 13. Also, the insulative film 14 minimizes a surface defect of the light emitting element LD, thereby improving the lifespan and light emission efficiency of the light emitting element LD. Also, in case that light emitting elements LD are densely disposed, the insulative film 14 can prevent an unwanted short circuit which may occur between the light emitting elements LD. Whether the insulative film 14 is provided is not limited as long as the active layer 12 can prevent occurrence of a short circuit with external conductive material.

In an embodiment, the insulative film 14 may be provided in a shape entirely surrounding an outer circumference of the light emitting stack structure including the first semiconductor layer 11, the active layer 12, and the second semiconductor layer 13.

Although a case where the insulative film 14 is provided in a shape entirely surrounding an outer circumference of each of the first semiconductor layer 11, the active layer 12, and the second semiconductor layer 13 is described in the above-described embodiment, the disclosure is not limited thereto.

In an embodiment, the insulative film 14 may include a transparent insulating material. For example, the insulative film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium dioxide ($TiO_2$), hafnium oxide ($HfO_x$), titanium strontium oxide ($SrTiO_x$), cobalt oxide ($Co_xO_y$), magnesium oxide (MgO), zinc oxide ($ZnO_x$), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride (AlN$_x$), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the disclosure is not limited thereto, and various materials having insulating properties may be used as the material of the insulative film 14.

In an embodiment, the insulative film 14 may be provided in the form of a single layer or be provided in the form of a multi-layer including at least two layers.

The above-described light emitting element LD may be used as a light emitting source (or light source) for various display devices. The light emitting element LD may be manufactured through a surface treatment process. For example, in case that light emitting elements LD are mixed in a liquid solution (or solvent) to be supplied to each pixel area (e.g., an emission area of each pixel or an emission area of each sub-pixel), each light emitting element LD may be surface-treated such that the light emitting elements LD are not unequally condensed in the solution but equally dispersed in the solution.

A light emitting part (or light emitting device) including the above-described light emitting element LD may be used in various types of electronic devices that require a light source, including a display device. In case that light emitting elements LD are disposed in an emission area of each pixel of a display panel, the light emitting elements LD may be used as a light source of the pixel. However, the application field of the light emitting element LD is not limited to the above-described example. For example, the light emitting element LD may be used for other types of electronic devices that require a light source, such as a lighting device.

However, this is merely illustrative, and a light emitting element applied to display devices in accordance with embodiments of the disclosure is not limited thereto. For example, the light emitting element may be a flip chip type micro light emitting diode or an organic light emitting element including an organic emitting layer.

Figure 3:
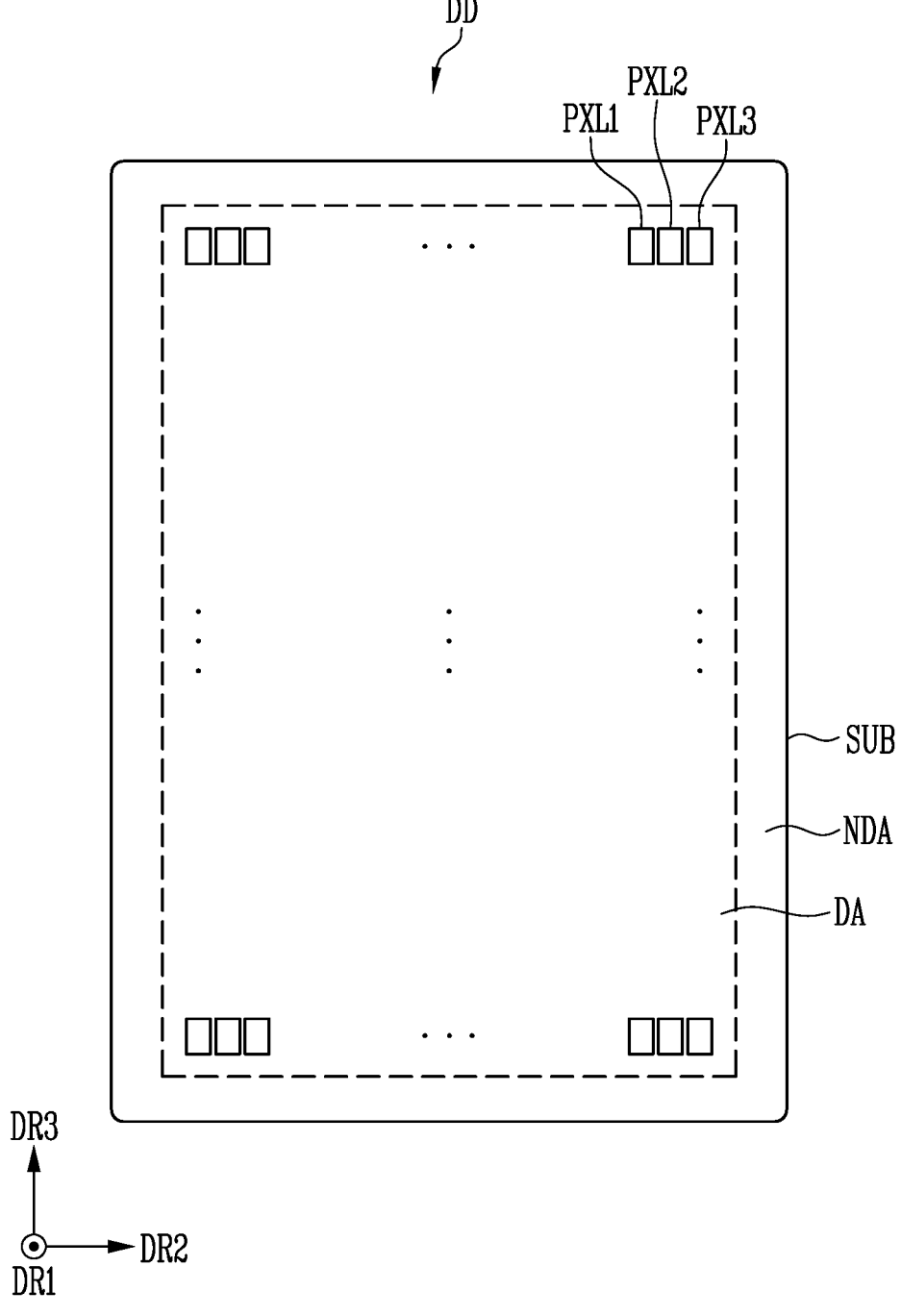
FIG. 3 is a schematic plan view illustrating a display device in accordance with embodiments of the present disclosure.

FIG. 3 is a schematic plan view illustrating a display device in accordance with embodiments of the disclosure.

Referring to FIGS. 1, 2, and 3, a display device DD may include a substrate SUB, pixels PXL1, PXL2, and PXL3 which are provided on the substrate SUB and each include at least one light emitting element LD, a driving part which is provided on the substrate SUB and drives the pixels PXL1, PXL2, and PXL3, and a line part which connects the pixels PXL1, PXL2, and PXL3 to the driving part.

In an embodiment, the substrate SUB may include a display area DA and a non-display area NDA.

In an embodiment, the display area DA may be an area in which the pixels PXL1, PXL2, and PXL3 for displaying an image are provided. The non-display area NDA may be an area in which the driving part for driving the pixels PXL1, PXL2, and PXL3 and a portion of the line part which connects the pixels PXL1, PXL2, and PXL3 to the driving part are provided.

In an embodiment, the non-display area NDA may be located adjacent to the display area DA. The non-display area NDA may be provided at at least one side of the display area DA. In an example, the non-display area NDA may surround a circumference (or edge) of the display device DA.

In an embodiment, the line part may electrically connect the pixels PXL1, PXL2, and PXL3 to the driving part. The line part may include a fan-out line connected to signal lines, e.g., a scan line, a data line, an emission control line, and the like, which provide signals to each of the pixels PXL1, PXL2, and PXL3 and are connected to each of the pixels PXL1, PXL2, and PXL3.

In an embodiment, the substrate SUB may include a transparent insulating material to enable light to be transmitted therethrough. The substrate SUB may be a rigid substrate or a flexible substrate.

In an embodiment, the pixels PXL1, PXL2, and PXL3 may include a first pixel PXL1, a second pixel PXL2, and a third pixel PXL3. In an embodiment, the first pixel PXL1 may be a red pixel, the second pixel PXL2 may be a green pixel, and the third pixel PXL3 may be a blue pixel. However, the disclosure is not limited thereto, and each of the pixels PXL1, PXL2, and PXL3 may emit light of another color instead of red, green, and blue.

In an embodiment, each of the pixels PXL1, PXL2, and PXL3 may include at least one light emitting element LD driven by a corresponding scan signal and a corresponding data signal. The light emitting element LD may have a small size to a degree of a nano scale (or nanometers) to a micro scale (micrometers), and be connected in parallel to light emitting elements disposed adjacent thereto. However, the disclosure is not limited thereto. The light emitting element LD may constitute a light source of each of the pixels PXL1, PXL2, and PXL3.

Figure 4:
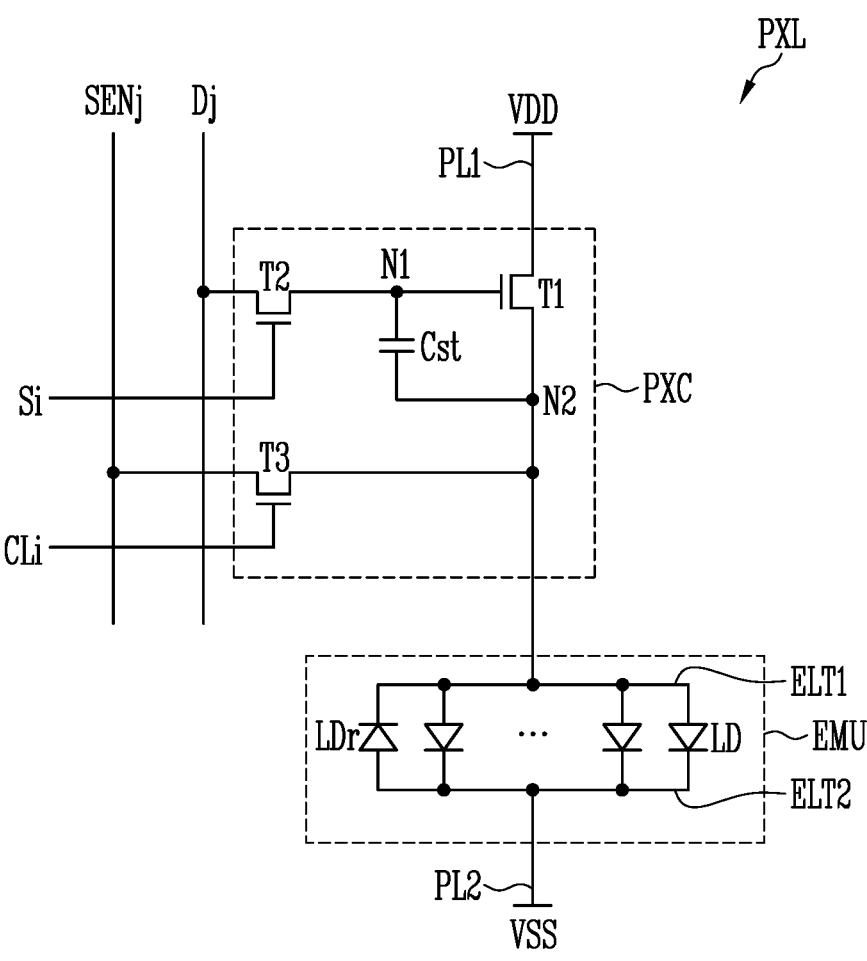
FIG. 4 is a schematic diagram of an equivalent circuit illustrating an example of a pixel included in the display device shown in FIG. 3.

FIG. 4 is a schematic diagram of an equivalent circuit illustrating an example of the pixel included in the display device shown in FIG. 3.

In the following embodiment, in case that a first pixel PXL1, a second pixel PXL2, and a third pixel PXL3 are inclusively designated, each of the first pixel PXL1, the second pixel PXL2, and the third pixel PXL3 will be referred to as a "pixel PXL."

Referring to FIGS. 1, 2, 3, and 4, the pixel PXL may include a pixel circuit PXC and a light emitting part or light emitting unit EMU (or light emitting layer).

Referring to FIGS. 1 to 4, the pixel PXL may include a light emitting part EMU (or light emitting layer) which generates light with a luminance corresponding to a data signal. Also, the pixel PXL may selectively further include a pixel circuit PXC for driving the light emitting part EMU.

In some embodiments, the light emitting part EMU may include light emitting elements LD connected in parallel between a first power line PL1 connected to a first driving power source VDD to be applied with a voltage of the first driving power source VDD and a second power line PL2 connected to a second driving power source VSS to be applied with a voltage of the second driving power source VSS. For example, the light emitting part EMU may include a first connection electrode ELT1 connected to the first driving power source VDD via the pixel circuit PXC and the first power line PL1, a second connection electrode ELT2 connected to the second driving power source VSS through the second power line PL2, and light emitting elements LD connected in parallel in a same direction between the first and second connection electrodes ELT1 and ELT2. In an embodiment, the first connection electrode ELT1 may be an anode, and the second connection electrode ELT2 may be a cathode.

In an embodiment, each of the light emitting elements LD included in the light emitting part EMU may include an end portion connected to the first driving power source VDD through the first connection electrode ELT1 and another end portion connected to the second driving power source VSS through the second connection electrode ELT2. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set to be equal to or higher than a threshold voltage of the light emitting elements LD during an emission period of the pixel PXL.

As described above, the light emitting elements LD connected in parallel in a same direction (e.g., a forward direction) between the first connection electrode ELT1 and the second connection electrode ELT2, to which voltages having difference potentials are supplied, may form respective effective light sources.

In an embodiment, each of the light emitting elements LD of the light emitting part EMU may emit light with a luminance corresponding to a driving current supplied through a corresponding pixel circuit PXC. For example, the pixel circuit PXC may supply, to the light emitting part EMU, a driving current corresponding to a grayscale value of corresponding frame data during each frame period. The driving current supplied to the light emitting part EMU may be divided to flow through each of the light emitting elements LD. Accordingly, the light emitting part EMU can emit light with a luminance corresponding to the driving current while each light emitting element LD is emitting light with a luminance corresponding to the driving current flowing therethrough.

Although an embodiment in which the end portions of the light emitting elements LD are connected in a same direction between the first and second driving power sources VDD and VSS has been described, but the disclosure is not limited thereto. In some embodiments, the light emitting part EMU may further include at least one ineffective light source, e.g., a reverse light emitting element LDr, in addition to the light emitting elements LD forming the respective effective light sources. The reverse light emitting element LDr is connected in parallel together with the light emitting elements LD forming the effective light sources between the first and second connection electrodes ELT1 and ELT2, and may be connected between the first and second connection electrodes ELT1 and ELT2 in a direction opposite to that in which the light emitting elements LD are connected. Although a driving voltage (e.g., a predetermined or selectable driving voltage or forward driving voltage) is applied between the first and second connection electrodes ELT1 and ELT2, the reverse light emitting element LDr may maintain an inactivated state, and accordingly, no current substantially flows through the reverse light emitting element LDr.

The pixel circuit PXC may be connected to a scan line Si and a data line Dj of the pixel PXL. Also, the pixel circuit PXC may be connected to a control line CLi and a sensing line SENj of the pixel PXL. In an example, in case that the pixel PXL is disposed on an ith row and a jth column of the display area DA, the pixel circuit PXC of the pixel PXL may be connected an ith scan line Si, a jth data line Dj, an ith control line CLi, and a jth sensing line SENj of the display area DA.

The pixel circuit PXC may include first to third transistors T1 to T3 and a storage capacitor Cst.

The first transistor T1 may be a driving transistor for controlling a driving current applied to the light emitting part EMU, and may be connected between the first driving power source VDD and the light emitting part EMU. Specifically, a first terminal of the first transistor T1 may be connected (or coupled) to the first driving power source VDD through the first power line PL1, a second terminal of the first transistor T1 may be connected to a second node N2, and a gate electrode of the first transistor T1 may be connected to a first node N1. The first transistor T1 may control an amount of driving current applied to the light emitting part EMU through the second node N2 from the first driving power source VDD according to a voltage applied to the first node N1. In an embodiment, the first terminal of the first transistor T1 may be a drain electrode, and the second terminal of the first transistor T1 may be a source electrode. However, the disclosure is not limited thereto. In some embodiments, the first terminal may be the source electrode, and the second terminal may be the drain electrode.

The second transistor T2 may be a switching transistor which selects a pixel PXL in response to a scan signal and activates the pixel PXL, and may be connected between the data line Dj and the first node N1. A first terminal of the second transistor T2 may be connected to the data line Dj, a second terminal of the second transistor T2 may be connected to the first node N1, and a gate electrode of the second transistor T2 may be connected to the scan line Si. The first terminal and the second terminal of the second transistor T2 may be different terminals. For example, in case that the first terminal is a drain electrode, the second terminal may be a source electrode.

The second transistor T2 may be turned on in case that a scan signal having a gate-on voltage (e.g., a high-level voltage) is supplied from the scan line Si, to electrically connect the data line Dj and the first node N1 to each other. The first node N1 may be a point at which the second terminal of the second transistor T2 and the gate electrode of the first transistor T1 are connected to each other, and the second transistor T2 may transfer a data signal to the gate electrode of the first transistor T1.

The third transistor T3 connects the first transistor T1 to the sensing line SENj, to acquire a sensing signal through the sensing line SENj and to detect a characteristic of the pixel PXL, including a threshold voltage of the first transistor, or the like, by using the sensing signal. Information on the characteristic of the pixel PXL may be used to convert image data such that a characteristic deviation between pixels PXL can be compensated for. A second terminal of the third transistor T3 may be connected to the second terminal of the first transistor T1, a first terminal of the third transistor T3 may be connected to the sensing line SENj, and a gate electrode of the third transistor T3 may be connected to the control line CLi. Also, the first terminal of the third transistor T3 may be connected to an initialization power source. The third transistor T3 is an initialization transistor capable of initializing the second node N2. The third transistor T3 may be turned on in case that a sensing control signal is supplied from the control line CLi, to transfer a voltage of the initialization power source to the second node N2. Accordingly, a second storage electrode of the storage capacitor Cst, which is connected to the second node N2, may be initialized.

A first storage electrode of the storage capacitor Cst may be connected to the first node N1, and the second storage electrode of the storage capacitor Cst may be connected to the second node N2. The storage capacitor Cst may charge to a data voltage corresponding to the data signal supplied to the first node N1 during one frame period. Accordingly, the storage capacitor Cst may store a voltage corresponding to the difference between a voltage of the gate electrode of the first transistor T1 and a voltage of the second node N2.

Although FIG. 4 illustrates an embodiment in which the light emitting elements LD constituting (or forming) the light emitting part EMU are all connected in parallel, the disclosure is not limited thereto. In some embodiments, the light emitting part EMU may be configured to include at least one serial stage (or stage) including light emitting elements LD connected in parallel to each other. For example, the light emitting part EMU may be configured in a series/parallel hybrid structure.

Figure 5:
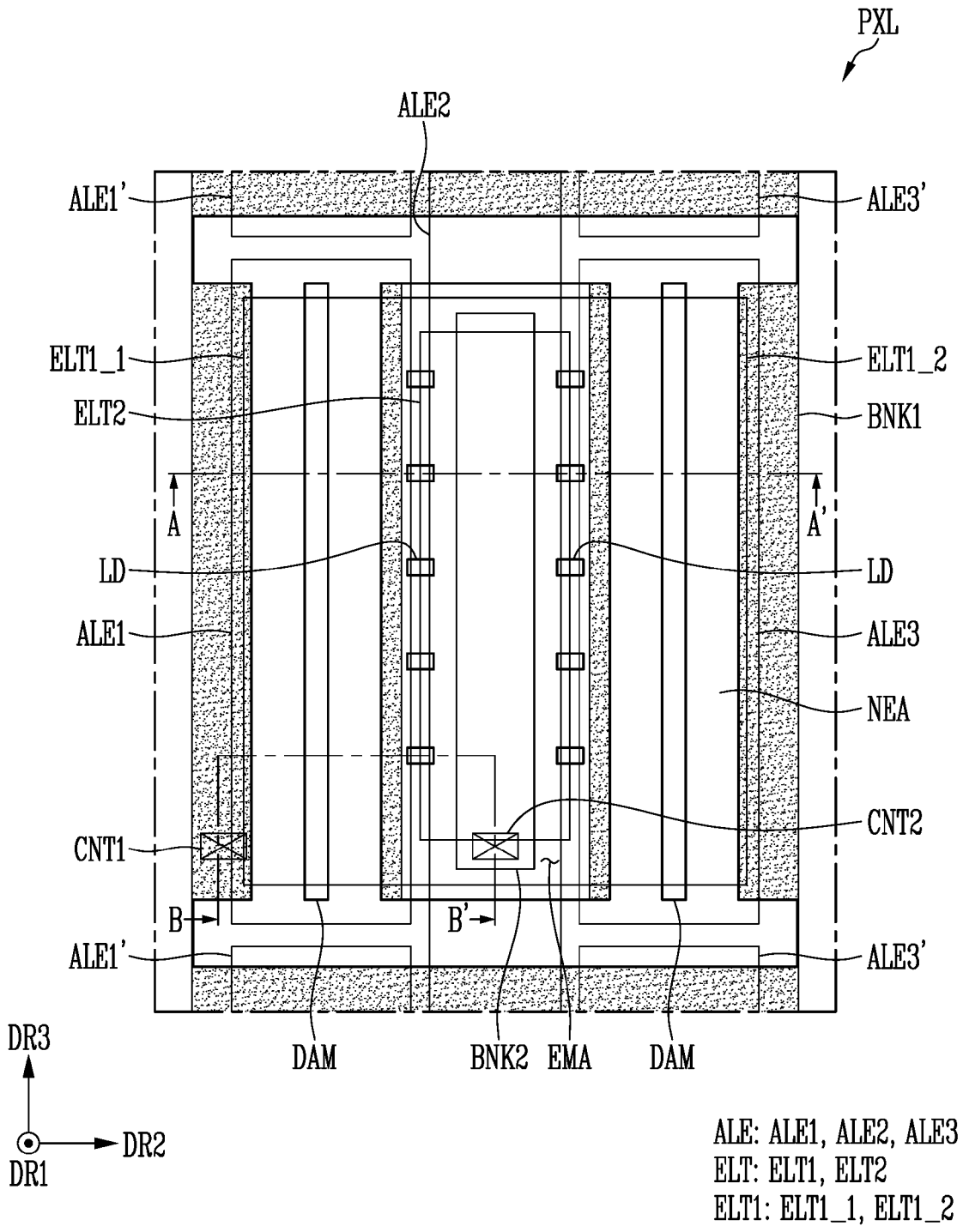
FIG. 5 is a schematic plan view illustrating an example of the pixel included in the display device shown in FIG. 3.
Figure 6:
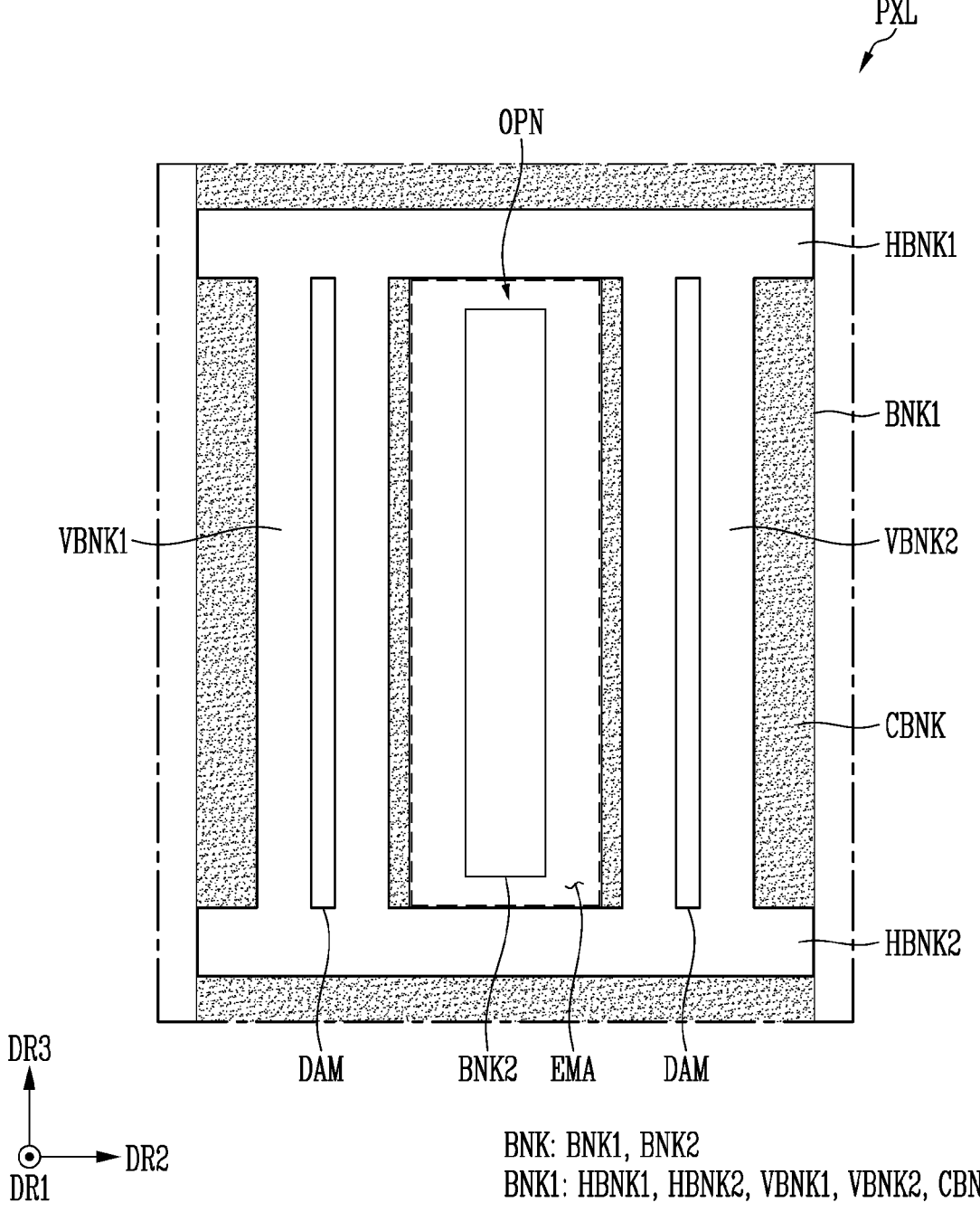
FIG. 6 is a schematic plan view illustrating an example of a first bank and a second bank, which partition pixels included in the display device shown in FIG. 3.

FIG. 5 is a schematic plan view illustrating an example of the pixel included in the display device shown in FIG. 3. FIG. 6 is a schematic plan view illustrating an example of a first bank and a second bank, which partition the pixels included in the display device shown in FIG. 3.

FIG. 5 is a schematic view illustrating some components included in a pixel PXL. FIG. 6 is a schematic view illustrating an emission area EMA and a non-emission area NEA of the pixel PXL, and is illustrated based on a first bank BNK1 and a second bank BNK2.

Referring to FIGS. 5 and 6, the display device may include a bank BNK, alignment electrodes ALE, light emitting elements LD, and connection electrodes ELT to constitute the pixel PXL.

FIGS. 5 and 6 illustrate an embodiment which includes three alignment electrodes ALE and includes two lanes on which the light emitting elements LD are disposed. However, the disclosure is not limited thereto, and the number of alignment electrodes ALE, the number of lanes, and the form of lanes may be variously changed.

In an embodiment, the pixel PXL may include an emission area EMA and a non-emission area NEA. The emission area EMA and the non-emission area NEA of the pixel PXL may be defined by the bank BNK.

In an embodiment, the bank BNK may include a first bank BNK1 and a second bank BNK2. In an example, the first bank BNK1 and the second bank BNK2 may form a space in which a fluid can be accommodated therebetween. For example, an ink including the light emitting elements LD may be provided in the space in which the fluid can be accommodated during a manufacturing process.

In an embodiment, the non-emission area NEA may be an area corresponding to an area in which the first bank BNK1 is disposed. In a plan view, the first bank BNK1 may surround the emission area EMA.

In an embodiment, the second bank BNK2 may be provided in the emission area EMA, and extend in a third direction DR3 in the emission area EMA. In an example, the second bank BNK2 may be designated as a "wall pattern," "protrusion pattern," or "support pattern." The second bank BNK2 may have a uniform width in the emission area EMA. The second bank BNK2 may have a bar-like shape having a constant width in an extending direction in the emission area EMA in a plan view, but the disclosure is not limited thereto.

In an embodiment, the second bank BNK2 may overlap a second alignment electrode ALE2 in a plan view.

In an embodiment, the emission area EMA may be an area in which the light emitting elements LD are disposed to emit light. The non-emission area NEA may be an area in which the light emitting elements LD are not disposed. The emission area EMA may be an area not overlapping the bank BNK in a plan view. The non-emission area NEA may be disposed to surround the emission area EMA. The non-emission area NEA may include an area overlapping the bank BNK.

Referring to FIG. 5, the pixel PXL may include alignment electrodes ALE. In an example, the alignment electrodes ALE may include a first alignment electrode ALE1 (or first electrode), a second alignment electrode ALE2 (or second electrode), a third alignment electrode ALE3 (or third electrode). The first to third alignment electrodes ALE1, ALE2, and ALE3 may extend in a first direction DR1. The first to third alignment electrodes ALE1, ALE2, and ALE3 may be sequentially arranged while being spaced apart from each other in a second direction DR2. The first to third alignment electrodes ALE1, ALE2, and ALE3 may be disposed on the bottom of the bank BNK. In this specification, the alignment electrodes ALE may be designated as alignment electrodes or electrodes.

In an embodiment, the first to third alignment electrodes ALE1, ALE2, and ALE3 may be electrodes for aligning the light emitting elements LD. For example, an electric field may be formed between (or on) the first alignment electrode ALE1 and the second alignment electrode ALE2, and light emitting elements LD may be aligned on the first alignment electrode ALE1 and the second alignment electrode ALE2, based on the electric field. An electric field may be formed between (or on) the second alignment electrode ALE2 and the third alignment electrode ALE3, and light emitting elements LD may be aligned on the second alignment electrode ALE2 and the third alignment electrode ALE3, based on the electric field. For example, the light emitting elements LD may be moved (or rotated) by a force (e.g., a dielectrophoresis (DEP) force) according to the electric field, to be aligned (or disposed) on the alignment electrodes.

In an embodiment, each of the first to third alignment electrodes ALE1, ALE2, and ALE3 may be supplied (or provided) with a first alignment signal or a second alignment signal in a process of aligning the light emitting elements LD (hereinafter, referred to as an alignment process).

In an embodiment, the first alignment signal and the second alignment signal may have different waveforms, different potentials, and/or different phases. The first alignment signal may be a ground signal, and the second alignment signal may be an AC signal. However, the disclosure is not limited to the above-described example. For example, the first alignment signal may be the AC signal, and the second alignment signal may be the ground signal. In an example, the first alignment signal may be applied to the first alignment electrode ALE1 and the third alignment electrode ALE3. The second alignment signal may be applied to the second alignment electrode ALE2 disposed between the first alignment electrode ALE1 and the third alignment electrode ALE3.

In an embodiment, the alignment electrodes ALE may be electrically connected to the pixel circuit PXC and/or a power line. For example, the first alignment electrode ALE1 may be electrically connected to the pixel circuit PXC and/or the first power line PL1 through a first contact CNT1, and the second alignment electrode ALE2 may be electrically connected to the second power line PL2 through a second contact hole CNT2.

In an embodiment, the first alignment signal may be applied to the first alignment electrode ALE1 and the third alignment electrode ALE3. The second alignment signal may be applied to the second alignment electrode ALE2 disposed between the first alignment electrode ALE1 and the third alignment electrode ALE3.

In an embodiment, the pixel PXL may include a first connection electrode ELT1 and a second connection electrode ELT2. In an example, the first connection electrode ELT1 and the second connection electrode ELT2 may be disposed on the alignment electrodes ALE1, ALE2, and ALE3, and the light emitting elements LD.

In an embodiment, a portion of the first connection electrode ELT1 may overlap the first bank BNK1. A portion of the second connection electrode ELT2 may overlap the second bank BNK2.

In an embodiment, a light emitting element LD may be electrically connected between a first part ELT1_1 of the first connection electrode ELT1 and the second connection electrode ELT2. The first part ELT1_1 of the first connection electrode ELT1 may be electrically connected to a first end portion of the light emitting element LD, and the second connection electrode ELT2 may be electrically connected to a second end portion of the light emitting element LD. In an example, a light emitting element LD may be electrically connected between the second connection electrode ELT2 and a second part ELT1_2 of the first connection electrode ELT1. The second connection electrode ELT2 may be electrically connected to a first end portion of the light emitting element LD, and the second part ELT1_2 of the first connection electrode ELT1 may be electrically connected to a second end portion of the light emitting element LD.

In an embodiment, the alignment electrodes ALE1, ALE2, and ALE3 may be electrically connected to the first connection electrode ELT1 and the second connection electrode ELT2. For example, the first alignment electrode ALE1 may be electrically connected to the first connection electrode ELT1 through a contact hole (not shown). The second alignment electrode ALE2 may be electrically connected to the second connection electrode ELT2 through a contact hole (not shown). The positions and number of contact holes for electrically connecting the alignment electrodes ALE1, ALE2, and ALE3 to the connection electrodes ELT1 and ELT2 are not limited to a specific example.

In an embodiment, a process of separating adjacent electrodes from each other may be performed such that each of pixels PXL in the display device is individually driven. Each of the first alignment electrode ALE1 and the second alignment electrode ALE2 may be electrically separated from a first alignment electrode ALE1' and a third alignment electrode ALE3' of another adjacent pixel PXL in the process.

The planar structure of the pixel PXL is not limited to the above-described example, and the pixel PXL may have various planar structures.

Referring to FIG. 6, the bank BNK may include a first bank BNK1 and a second bank BNK2.

In an embodiment, the first bank BNK1 and the second bank BNK2 may form a space in which a fluid can be accommodated. During a manufacturing process of the display device, an ink including the light emitting elements (see, e.g., FIG. 5) may be provided in the space in which the fluid can be accommodated.

In an embodiment, the first bank BNK1 may form an opening OPN. The first bank BNK1 may be disposed to protrude in the first direction DR1, and form the opening OPN. The second bank BNK2 may be disposed in the opening OPN.

In an embodiment, the second bank BNK2 may be disposed to be spaced apart from the first bank BNK1 in the second direction DR2. The second bank BNK2 may be disposed in the opening OPN formed by the first bank BNK1. The second bank BNK2 may protrude in the first direction DR1.

In an embodiment, the emission area EMA may be formed by the first bank BNK1 and the second bank BNK2 disposed in the opening OPN. In an example, the first bank BNK1 and the second bank BNK2 may surround the emission area EMA.

In an embodiment, the first bank BNK1 may include an area (hereinafter, referred to as a first area of the first bank BNK1) HBNK1, HBNK2, VBNK1, and VBNK2 in which an insulating material (e.g., a second insulating layer INS2 shown in FIG. 7) is not disposed on the first bank BNK1 and an area (hereinafter, referred to as a second area of the first bank BNK1) CBNK in which the insulating material is disposed on the first bank BNK1.

In an embodiment, the first area of the first bank BNK1 may include a first horizontal extension part HBNK1 and a second horizontal extension part HBNK2, which extend in the second direction DR2. In an example, the first horizontal extension part HBNK1 and the second horizontal extension part HBNK2 may be disposed to be spaced apart from each other in the third direction DR3. The first horizontal extension part HBNK1 and the second horizontal extension part HBNK2 may be provided to perform a process for separating adjacent electrodes such that the pixel PXL is individually driven.

In an embodiment, the first area of the first bank BNK1 may include a first vertical extension part VBNK1 and a second vertical extension part VBNK2, which extend in the third direction DR3. In an example, the first vertical extension part VBNK1 and the second vertical extension part VBNK2 may include a dam structure DAM.

In an embodiment, during the manufacturing process of the display device, an ink including the light emitting elements LD may be supplied to the emission area EMA between the first bank BNK1 and the second bank BNK2. In an example, the dam structure DAM may be disposed on the first vertical extension part VBNK1 and the second vertical extension part VBNK2 of the first bank BNK1 so as to prevent the ink including the light emitting elements LD from overflowing from the corresponding pixel PXL to an adjacent pixel in a process of supplying the ink to the emission area EMA.

In an embodiment, the first bank BNK1 may include the second area CBNK of the first bank BNK1, in which the insulating material (e.g., the second insulating layer INS2 shown in FIG. 7) is disposed on the top of the first bank BNK1. Referring to FIG. 6, the second area CBNK of the first bank BNK1 is indicated by hatching such that the position of the second area CBNK of the first bank BNK1 can be clearly described.

In an embodiment, the display device prevents the ink including the light emitting elements from overflowing to an adjacent pixel through the dam structure DAM of the first bank BNK1, thereby guiding the light emitting elements to be normally disposed in the emission area EMA of the corresponding pixel PXL. Accordingly, the pixels PXL can include a uniform number of light emitting elements LD.

Figure 7:
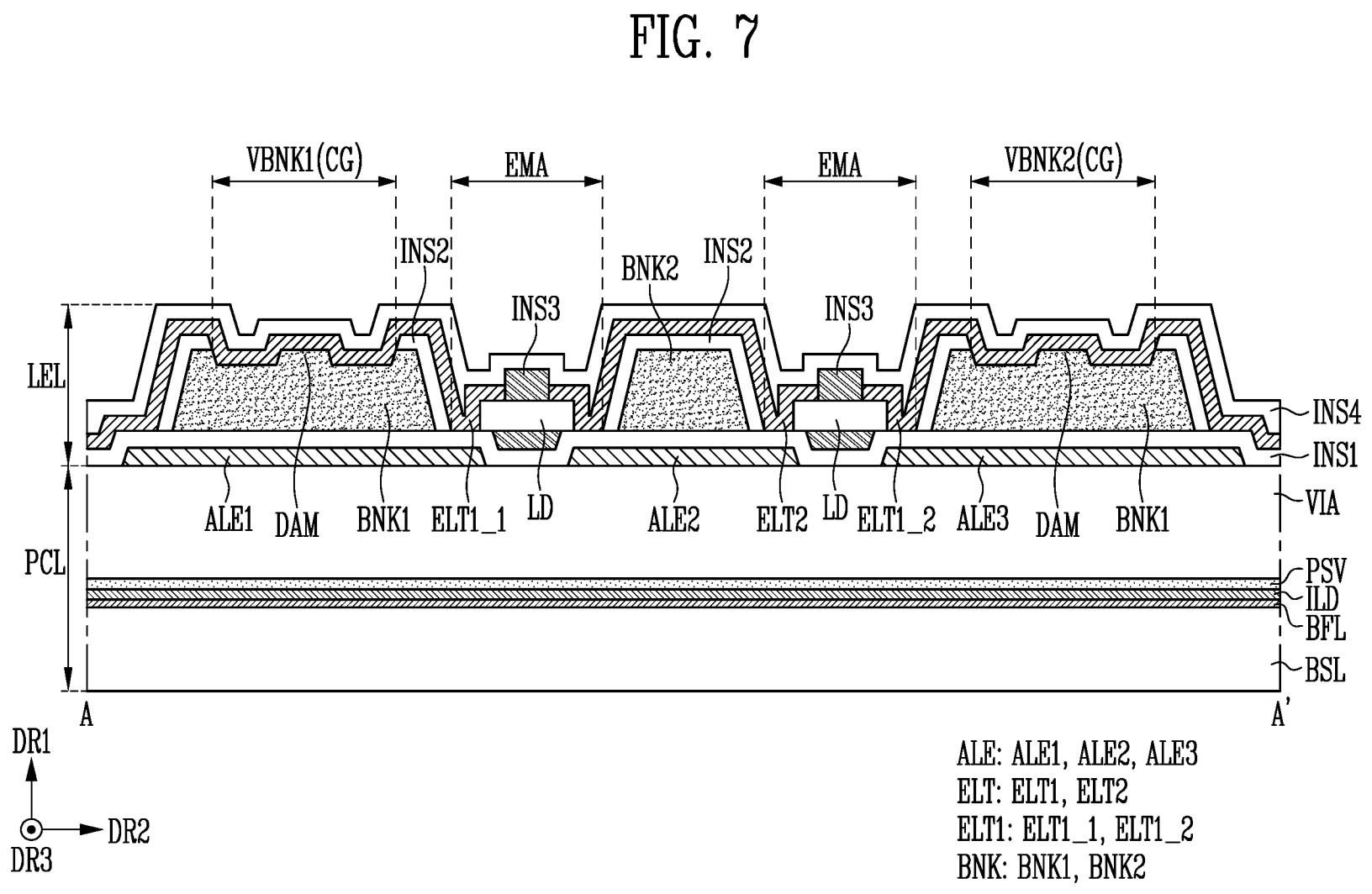
Figure 8:
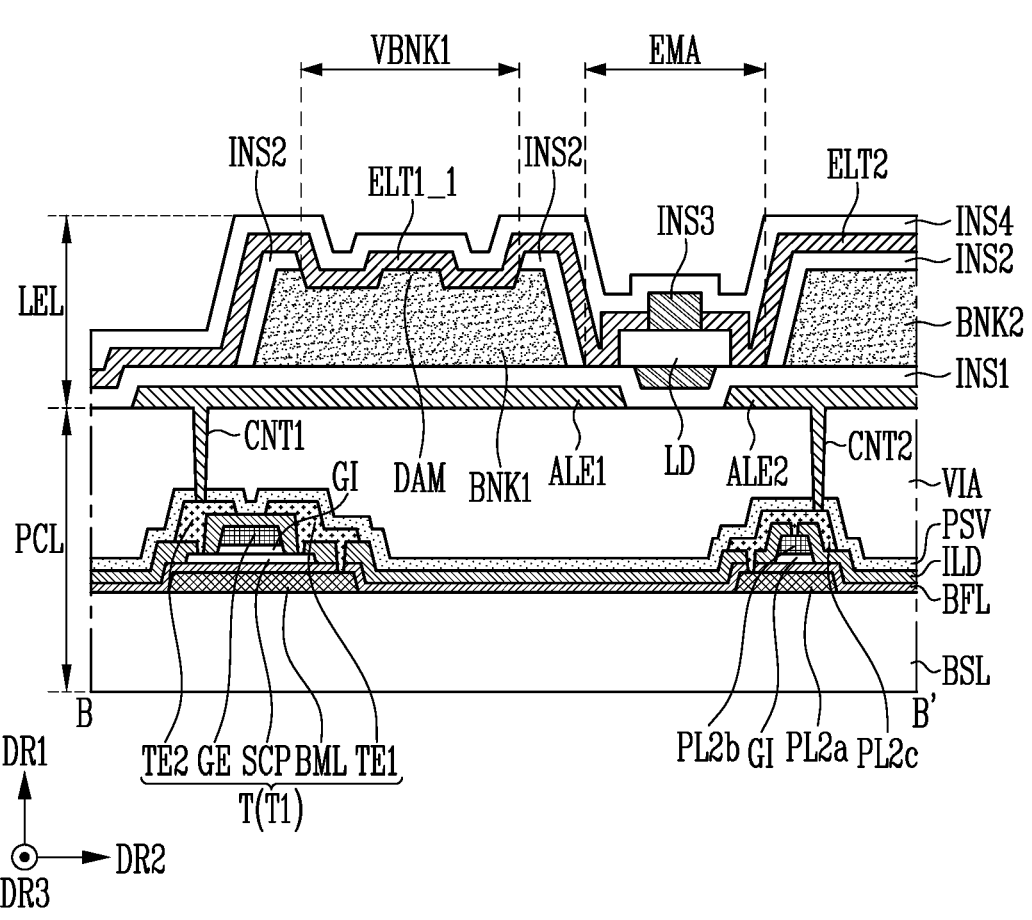
FIG. 8 is a schematic sectional view illustrating an example taken along line B-B' shown in FIG. 5.

FIG. 7 is a schematic sectional view illustrating an example taken along line A-A' shown in FIG. 5. FIG. 8 is a schematic sectional view illustrating an example taken along line B-B' shown in FIG. 5.

Referring to FIGS. 7 and 8, a pixel circuit layer PCL and a light emitting element layer LEL of the pixel PXL may include circuit elements including transistors T disposed on a base layer BSL and various lines connected thereto. The light emitting element layer LEL including electrodes ALE, light emitting elements LD, and/or connection electrodes ELT may be disposed on the pixel circuit layer PCL.

In an embodiment, the base layer BSL may be a rigid or flexible substrate or a film. In an example, the base layer BSL may be a rigid substrate made of glass or tempered glass, a flexible substrate (or thin film) made of a plastic or metal material, or at least one insulating layer. The material and/or property of the base layer BSL is not particularly limited. In an embodiment, the base layer BSL may be substantially transparent. The term "substantially transparent" may mean that light can be transmitted with a transmittance or more (e.g., a predetermined or selectable transmittance or more). In another embodiment, the base layer BSL may be translucent or opaque. Also, the base layer BSL may include a reflective material in some embodiments. In this specification, the base layer BSL may be designated as a base substrate or a substrate.

In an embodiment, a lower auxiliary electrode layer BML and a first power conductive layer PL2a may be disposed on the base layer BSL. The lower auxiliary electrode layer BML and the first power conductive layer PL2a may be disposed in (or dispose on) a same layer. For example, the lower auxiliary electrode layer BML and the first power conductive layer PL2a may be simultaneously formed through a same process, but the disclosure is not limited thereto. The first power conductive layer PL2a may constitute the second power line PL2 described with reference to FIG. 4 and the like.

In an embodiment, each of the lower auxiliary electrode layer BML and the first power conductive layer PL2a may be formed as a single layer or a multi-layer, which is made of (or include) at least one of molybdenum (Mo), copper (Cu), aluminum (Al), chromium (Cr), gold (Au), titanium (Ti), nickel (Ni), neodymium (Nd), and indium (In), tin (Sn), and any oxide or alloy thereof. However, the disclosure is not limited thereto.

In an embodiment, a buffer layer BFL may be disposed over the lower auxiliary electrode layer BML and the first power conductive layer PL2a. The buffer layer BFL may prevent an impurity from being diffused into each circuit element. The buffer layer BFL may be configured as a single layer, but be configured as a multi-layer including at least two layers. In case that the buffer layer BFL is provided as the multi-layer, the layers may be formed of (or include) a same material or be formed of different materials.

In an embodiment, a semiconductor pattern SCP may be disposed on the buffer layer BFL. In an example, the semiconductor pattern SCP may include a first region contacting a first transistor electrode TE1, a second region contacting a second transistor electrode TE2, and a channel region located between the first and second regions. In some embodiments, one of the first and second regions may be a source region, and the other of the first and second regions may be a drain region.

In an embodiment, the semiconductor pattern SCP may be made of poly-silicon, amorphous silicon, oxide semiconductor, etc. The channel region of the semiconductor pattern SCP is a semiconductor pattern undoped with an impurity, and may be an intrinsic semiconductor. Each of the first and second regions of the semiconductor pattern SCP may be a semiconductor pattern doped with a predetermined impurity.

In an embodiment, a gate insulating layer GI may be disposed on the buffer layer BFL and the semiconductor pattern SCP. In an example, the gate insulating layer GI may be disposed between the semiconductor pattern SCP and a gate electrode GE. Also, the gate insulating layer GI may be disposed between the buffer layer BFL and a second power conductive layer PL2b. The gate insulating layer GI may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited thereto.

In an embodiment, the gate electrode GE of the transistor T and the second power conductive layer PL2b may be disposed on the gate insulating layer GI. For example, the gate electrode GE and the second power conductive layer PL2b may be disposed in (or disposed on) a same layer. For example, the gate electrode GE and the second power conductive layer PL2b may be simultaneously formed through a same process, but the disclosure is not limited thereto. The gate electrode GE may be disposed on the gate insulating layer GI to overlap the semiconductor pattern SCP in the first direction DR1. The second power conductive layer PL2b may be disposed on the gate insulating layer GI to overlap the first power conductive layer PL2a in the first direction DR1. The second power conductive layer PL2b along with the first power conductive layer PL2a may constitute the second power line PL2 described with reference to FIG. 4 and the like.

In an embodiment, each of the gate electrode GE and the second power conductive layer PL2b may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or alloy thereof. However, the disclosure is not limited thereto.

In an embodiment, an interlayer insulating layer ILD may be disposed over the gate electrode GE and the second power conductive layer PL2b. In an example, the interlayer insulating layer ILD may be disposed between the gate electrode GE and the first and second transistor electrodes TE1 and TE2. Also, the interlayer insulating layer ILD may be disposed between the second power conductive layer PL2b and a third power conductive layer PL2c.

In an embodiment, the interlayer insulating layer ILD may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited thereto.

In an embodiment, the first and second transistor electrodes TE1 and TE2 of the transistor T and the third power conductive layer PL2c may be disposed on the interlayer insulating layer ILD. The first and second transistor electrodes TE1 and TE2 and the third power conductive layer PL2c may be disposed in a same layer. For example, the first and second transistor electrodes TE1 and TE2 and the third power conductive layer PL2c may be simultaneously formed through a same process, but the disclosure is not limited thereto.

In an embodiment, the first and second transistor electrodes TE1 and TE2 may be disposed to overlap the semiconductor pattern SCP in the first direction DR1. The first and second transistor electrodes TE1 and TE2 may be electrically connected to the semiconductor pattern SCR For example, the first transistor electrode TE1 may be electrically connected to the first region of the semiconductor pattern SCP through a contact hole penetrating the interlayer insulating layer ILD. Also, the first transistor electrode TE1 may be electrically connected to the lower auxiliary electrode layer BML through a contact hole penetrating the interlayer insulating layer ILD and the buffer layer BFL. The second transistor electrode TE2 may be electrically connected to the second region of the semiconductor pattern SCP through a contact hole penetrating the interlayer insulating layer ILD. In some embodiments, any one of the first and second transistor electrodes TE1 and TE2 may be a source electrode, and the other of the first and second transistor electrodes TE1 and TE2 may be a drain electrode. The second transistor electrode TE2 may be electrically connected to a first alignment electrode ALE1 through a first contact hole CNT1 penetrating a protective layer PSV and a via layer VIA.

In an embodiment, the third power conductive layer PL2$c$ may be disposed to overlap the first power conductive layer PL2$a$ and/or the second power conductive layer PL2$b$ in the first direction DR1. The third power conductive layer PL2$c$ may be electrically connected to the first power conductive layer PL2$a$ and/or the second power conductive layer PL2$b$. For example, the third power conductive layer PL2$c$ may be electrically connected to the first power conductive layer PL2$a$ through a contact hole penetrating the interlayer insulating layer ILD and the buffer layer BFL. Also, the third power conductive layer PL2$c$ may be electrically connected to the second power conductive layer PL2$b$ through a contact hole penetrating the interlayer insulating layer ILD. The third power conductive layer PL2$c$ along with the first power conductive layer PL2$a$ and/or the second power conductive layer PL2$b$ may constitute the second power line PL2 described with reference to FIG. 4 and the like. The third power conductive layer PL2$c$ may be electrically connected to a second electrode ALE2 through a second contact hole CNT2 penetrating the protective layer PSV and the via layer VIA.

In an embodiment, the first and second transistor electrodes TE1 and TE2 and the third power conductive layer PL2$c$ may be formed as a single layer or a multi-layer, which is made of molybdenum (Mo), copper (Cu), aluminum (Al), chromium (Cr), gold (Au), titanium (Ti), nickel (Ni), neodymium (Nd), indium (In), tin (Sn), and any oxide or alloy thereof. However, the disclosure is not limited thereto.

In an embodiment, the protective layer PSV may be disposed over the first and second transistor electrodes TE1 and TE2 and the third power conductive layer PL2$c$. The protective layer PSV may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited thereto.

In an embodiment, the via layer VIA may be disposed on the protective layer PSV. The via layer VIA may be made of an organic material to planarize a step difference (e.g., a lower step difference). The step difference may be a height or thickness difference. For example, the via layer VIA may include an organic material such as acrylic resin, epoxy resin, phenolic resin, polyamides resin, polyimides resin, polyester resin, poly-phenylene sulfide resin, or benzocyclobutene (BCB). However, the disclosure is not limited thereto, and the via layer VIA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment, alignment electrodes ALE may be disposed on the via layer VIA of the pixel circuit layer PCL. First to third alignment electrodes ALE1, ALE2, and ALE3 may be disposed to be spaced apart from each other, and be disposed in a same layer. For example, the alignment electrodes ALE may be simultaneously formed through a same process.

In an embodiment, the alignment electrodes ALE may be supplied with an alignment signal in a process of aligning light emitting elements LD. Accordingly, an electric field is formed between the alignment electrodes ALE, so that the light emitting elements LD can be aligned between the alignment electrodes ALE.

In an embodiment, the alignment electrodes ALE may be formed roughly flat. For example, the alignment electrodes ALE may be formed on the via layer VIA in which any separate step difference is not formed. In case that a process of patterning the alignment electrodes ALE is performed, the alignment electrodes ALE can be uniformly patterned, and a process variation in the patterning process can be substantially decreased.

In an embodiment, the alignment electrodes ALE may include at least one conductive material. In an example, the alignment electrodes ALE may include at least one metal among various metals including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and the like, or any alloy including the at least one metal, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and Fluorine doped Tin Oxide (FTO), and at least one conductive material among conductive polymers such as PEDOT, but the disclosure is not limited thereto.

In an embodiment, a first insulating layer INS1 may be disposed over the alignment electrodes ALE. The first insulating layer INS1 may have a single-layer structure or a multi-layer structure. The first insulating layer INS1 may include an inorganic material. For example, the first insulating layer INS1 may include at least one selected from the group consisting of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited thereto.

In an embodiment, although not shown in FIG. 7, the first alignment electrode ALE1 and the second alignment electrode ALE2 may be exposed by the first insulating layer INS1. The first alignment electrode ALE1 may be electrically connected to a first part ELT1_1 of a first connection electrode ELT1 through a contact hole (not shown) disposed at a position corresponding to an exposed area thereof, and the second alignment electrode ALE2 may be electrically connected to a second connection electrode ELT2 through a contact hole (not shown) disposed at a position corresponding to an exposed area thereof.

In an embodiment, the first insulating layer INS1 may cover the alignment electrodes ALE. In an example, a bank BNK may be disposed on the first insulating layer INS1. In an example, a surface of the first insulating layer INS1 may contact a first bank BNK1 and a second bank BNK2. In an example, the first insulating layer INS1 may protect the alignment electrodes ALE from influence during a manufacturing process of the display device. In an example, the first insulating layer INS1 may cover the alignment electrodes ALE. Accordingly, the first insulating layer INS1 can substantially prevent a developer for patterning an organic material for forming the bank BNK from damaging the alignment electrodes ALE.

In an embodiment, the first bank BNK1 and the second bank BNK2 may be disposed on the first insulating layer INS1. In an example, in case that an ink for providing the light emitting elements LD is supplied to the pixel PXL, the first bank BNK1 and the second bank BNK2 may define an area in which the ink is supplied. The first bank BNK1 and the second bank BNK2 may correspond to a structure defining a space in which the ink can be accommodated. For example, the ink may be accommodated in a space in which the first bank BNK1 and the second bank BNK2 are not disposed. In an example, a measure of capacity with which the ink can be accommodated may be determined according to a form of the first bank BNK1 and the second bank BNK2, or the like.

In an embodiment, the first bank BNK1 and the second bank BNK2 may protrude in the first direction DR1.

In an embodiment, the first bank BNK1 may include a concave groove CG in an area corresponding to a first vertical extension part VBNK1 and a second vertical extension part VBNK2. In an example, the concave groove CG formed in the first bank BNK1 may be an area (or groove) recessed in the opposite direction of the first direction DR1.

In an embodiment, a dam structure DAM protruding in the first direction DR1 may be included in the concave groove CG formed in the first bank BNK1. In an example, the dam structure DAM may partition the area recessed in the concave groove CG.

In an embodiment, the first bank BNK1 may include the concave groove CG so as to increase a capacity with which the ink including the light emitting elements LD can be accommodated, and the dam structure DAM may be formed in the concave groove CG so as to prevent light emitting elements LD from overflowing to an emission area of an adjacent pixel and to allow the light emitting elements LD to be placed at positions at which the light emitting elements LD are to be aligned. In case that the light emitting elements LD included in the ink are supplied, the light emitting elements LD may have a tendency to be disposed in the emission area EMA, and be uniformly disposed.

In an embodiment, a second insulating layer INS2 may cover a sidewall (e.g., an outer sidewall S4 shown in FIG. 9) of the first bank BNK1 and the second bank BNK2. In an example, the sidewall of the first bank BNK1 except an area corresponding to the concave groove CG of the first bank BNK1 may be covered by the second insulating layer INS2. The second bank BNK2 may be entirely covered by the second insulating layer INS2.

In an embodiment, the second insulating layer INS2 may have a single-layer structure or a multi-layer structure. The second insulating layer INS2 may include an inorganic material, and the second insulating layer INS2 and the first insulating layer INS1 may include a same material.

In an embodiment, the bank BNK may include an organic material, and the second insulating layer INS2 may include an inorganic material. In case that a plasma surface treatment process is performed, a surface of the organic material may have a hydrophobic surface characteristic, and a surface of the inorganic material may have a hydrophilic surface characteristic. Therefore, the concave groove CG of the first bank BNK1 may have the hydrophobic surface characteristic, and the second insulating layer INS2 covering the sidewall of the first bank BNK1 and the second bank BNK2 may have the hydrophilic surface characteristic.

In an embodiment, since an organic solvent and the ink including the light emitting elements LD have a hydrophilic characteristic, the ink and the light emitting elements LD included therein may have a tendency to be disposed in the emission area EMA in which the first insulating layer INS1 between the first bank BNK1 and the second bank BNK2 is disposed, rather than the area corresponding to the concave groove CG of the first bank BNK1.

In an embodiment, the light emitting elements LD may be disposed on the first insulating layer INS1. The light emitting elements LD may be disposed an area surrounded by the first bank BNK1 and the second bank BNK2.

In an embodiment, a third insulating layer INS3 may be disposed on the light emitting elements LD. In case that the third insulating layer INS3 is formed on the light emitting elements LD after the light emitting elements LD are completely aligned, the light emitting elements LD can be prevented from being separated from positions at which the light emitting elements LD are aligned.

In an embodiment, the third insulating layer INS3 may be configured as a single layer or a multi-layer, and include an inorganic material. In an example, the third insulating layer INS3 and the first insulating layer INS1 (and/or the second insulating layer INS2) may include a same material.

In an embodiment, the connection electrodes ELT may be disposed on end portions of the light emitting elements LD, which are exposed by the third insulating layer INS3.

In an embodiment, the first part ELT1_1 of the first connection electrode ELT1 and a second part ELT1_2 of the first connection electrode ELT1 may be disposed on the second insulating layer INS2 covering the sidewall of the first bank BNK1 and the concave groove CG of the first bank BNK1.

In an embodiment, the first connection electrode ELT1 may be disposed according to a shape of the second insulating layer INS2 covering the sidewall of the first bank BNK1 and a shape of the concave groove CG of the first bank BNK1. A second connection electrode ELT2 may be disposed on the second insulating layer INS2 covering the second bank BNK2.

In an embodiment, the connection electrodes ELT may be disposed in a same layer. For example, the connection electrodes ELT may be configured with a same conductive layer. The connection electrodes ELT may be simultaneously formed through a same process. However, the disclosure is not limited to the above-described example. For example, the connection electrodes ELT may be formed through different processes. For example, after the first connection electrode ELT1 is patterned, the second connection electrode ELT2 may be patterned.

In an embodiment, the connection electrodes ELT may be configured with various transparent conductive materials. In an example, the connection electrodes ELT may include at least one of various transparent conductive materials including Indium Tin Oxide (ITO), Indium Zinc Oxide (IZO), Indium Tin Zinc Oxide (ITZO), Aluminum doped Zinc Oxide (AZO), Gallium doped Zinc Oxide (GZO), Zinc Tin Oxide (ZTO), and Gallium Tin Oxide (GTO), and be implemented substantially transparently or translucently to satisfy a transmittance (e.g., a predetermined or selectable transmittance). Accordingly, light emitted from the light emitting elements LD can be emitted to the outside of the display panel while passing through the connection electrodes ELT.

In an embodiment, a fourth insulating layer INS4 may be disposed on the first insulating layer INS1, the second insulating layer INS2, the connection electrodes ELT, and the third insulating layer INS3, to protect components of the light emitting element layer LEL. In some embodiments, the fourth insulating layer INS4 may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited thereto.

In an embodiment, the stacked structure of the pixel PXL is not limited to the above-described example. The pixel PXL may further include an additional insulating layer or an additional electrode layer, and have various structures.

Figure 9:
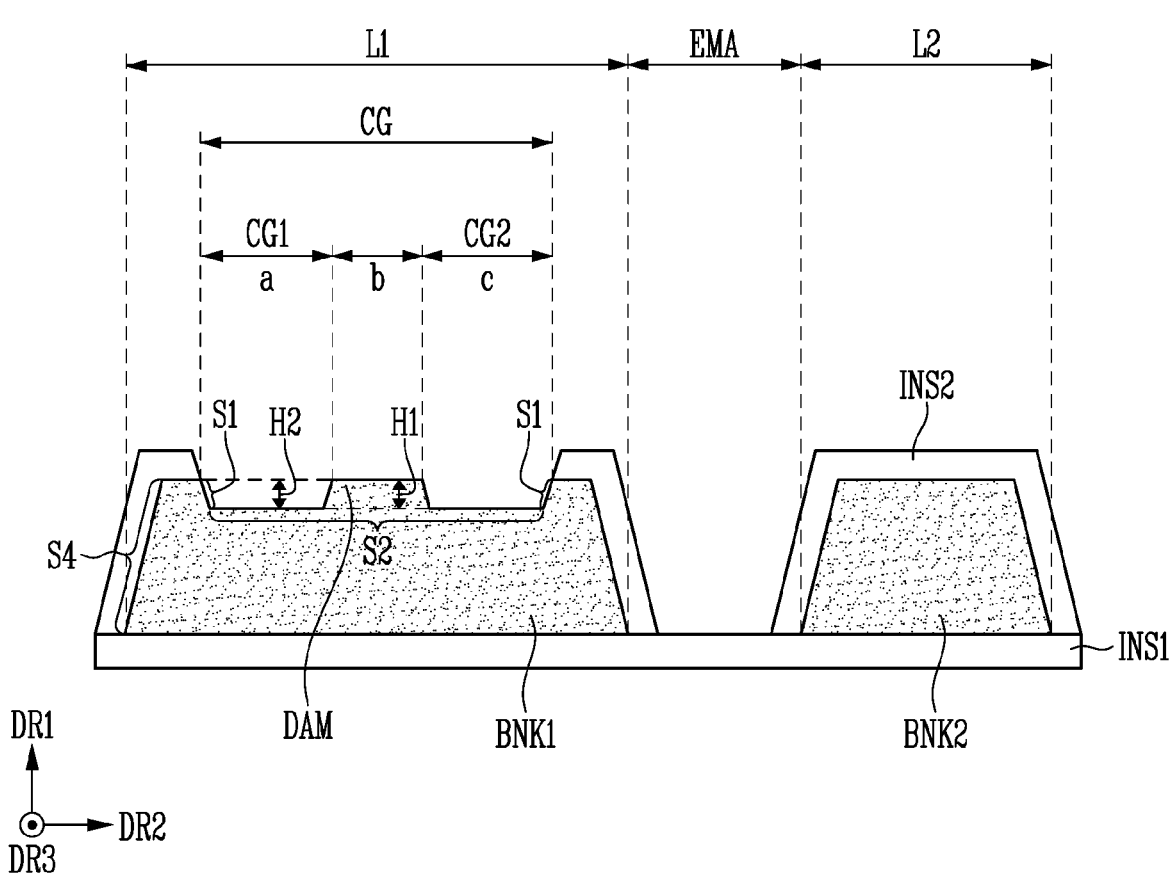
FIG. 9 is a schematic enlarged view illustrating shapes of the first bank and the second bank, which are shown in FIG. 5.

FIG. 9 is a schematic enlarged view illustrating shapes of the first bank and the second bank, which are shown in FIG. 5.

In an embodiment, the first bank BNK1 and the second bank BNK2 may be disposed while being spaced apart from each other in the second direction DR2. In an example, the first bank BNK1 and the second bank BNK2 may be disposed on the first insulating layer INS1 to protrude in the first direction DR1.

In an embodiment, the emission area EMA may be defined by the disposition of the first bank BNK1 and the second bank BNK2.

In an embodiment, a width L1 of the first bank BNK1 in the second direction DR2 may be longer than a width L2 of the second bank BNK2 in the second direction DR2. In an example, the width L1 of the first bank BNK1 including the concave groove CG may be secured, thereby securing a capacity with which the ink including the light emitting elements LD (see FIG. 5) can be accommodated.

In an embodiment, the first bank BNK1 may include an inner sidewall S1 and a flat surface S2, which define the concave groove CG, and an outer sidewall S4 surrounding the concave groove CG.

In an embodiment, the first bank BNK1 may include a dam structure DAM protruding in the first direction DR1 on the flat surface S2. The dam structure DAM may partition the concave groove CG into a first concave groove CG1 and a second concave groove CG2. The first concave groove CG1 and the second concave groove CG2 may be symmetrical to each other with respect to the dam structure DAM. In an example, the dam structure DAM may be integral with the first bank BNK1. However, the disclosure is not limited thereto, and the dam structure DMA may be formed as an independent structure separately from the first bank BNK1.

In an embodiment, the second insulating layer INS2 may be disposed on the outer sidewall S4 of the first bank BNK1 and the second bank BNK2. In an example, when viewed in the first direction DR1, the second insulating layer INS2 and the concave groove CG may not overlap each other.

In an embodiment, the concave groove CG of the first bank BNK1 may have a hydrophobic surface characteristic, and the first insulating layer INS1 and the second insulating layer INS2 covering the second bank BNK2 may have a hydrophilic surface characteristic.

In an embodiment, the ink including the light emitting elements LD may be guided to be disposed in the emission area EMA in which the first insulating layer INS1 having the hydrophilic surface characteristic is disposed.

In an embodiment, a height H1 of the dam structure DAM protruding in the first direction DR1 with respect to the flat surface S2 may be equal to or smaller than a recess depth H2 representing a depth of the concave groove CG with respect to a boundary line between the outer sidewall S4 and the inner sidewall S1. The height H1 of the dam structure DAM and the depth of the concave groove CG may vary according to an etching process of the second insulating layer INS2 and the first bank BNK1.

The first concave groove CG1 may have a first length a, the second concave groove CG2 may have a second length c. The first concave groove CG1 and the second concave groove CG2 may be spaced apart by a distance b. The first and second lengths a, c and the distance b may be substantially equal to each other, or at least one of the distance b and the first and second lengths a, c may be different from at least another one of the distance b and the first and second lengths a, c.

Figure 10:
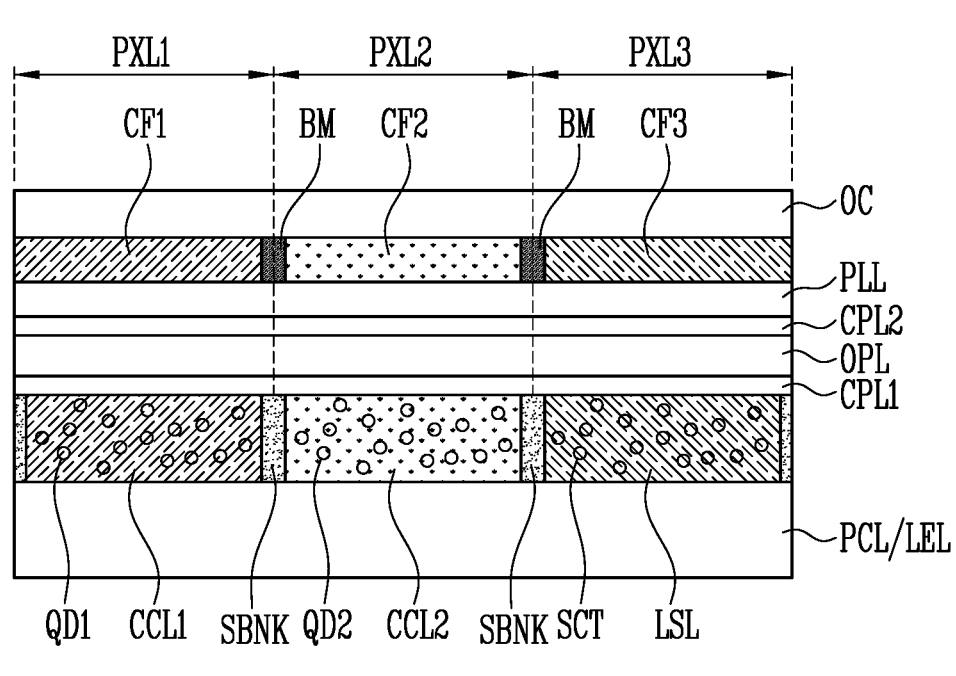
FIG. 10 is a schematic sectional view illustrating first to third pixels shown in FIG. 3.
Figure 10:

FIG. 10 is a schematic sectional view illustrating the first to third pixels shown in FIG. 3.

FIG. 10 illustrates a color conversion layer CCL, an optical layer OPL, and/or a color filter layer CFL. In FIG. 10, for convenience of description, a portion of a detailed configuration of the pixel circuit layer PCL and the light emitting element layer LEL will be omitted.

Referring to FIG. 10, a separation bank SBNK may be disposed between first to third pixels PXL1, PXL2, and PXL3 or at a boundary of the first to third pixels PXL1, PXL2, and PXL3, and form an opening overlapping each of the first to third pixels PXL1, PXL2, and PXL3. The opening formed by the separation bank SBNK may provide a space in which the color conversion layer CCL can be provided. For example, a desired kind and/or a desired amount of color conversion layer CCL may be supplied to the space partitioned by the opening formed by the separation bank SBNK.

In an embodiment, the separation bank SBNK may be disposed on the first bank BNK1 (e.g., the first bank BNK1 shown in FIG. 7) while overlapping the first bank BNK1. The separation bank SBNK is not disposed on the second bank BNK2. In an example, in a plan view, the separation bank SBNK may overlap the first bank BNK1, but may not overlap the second bank BNK2.

In an embodiment, the separation bank SBNK may include an organic material such as acrylic resin, epoxy resin, phenolic resin, polyamide resin, polyimide resin, polyester resin (e.g., unsaturated polyester resin), poly-phenylene ether resin, poly-phenylene sulfide resin, or benzocyclobutene (BCB). However, the disclosure is not limited thereto, and the separation bank SBNK may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In an embodiment, the separation bank SBNK may include at least one light blocking material and/or at least one reflective material. Accordingly, light leakage between adjacent pixels PXL can be prevented. For example, the separation bank SBNK may include a black pigment, but the disclosure is not limited thereto.

In an embodiment, the color conversion layer CCL may be disposed above light emitting elements LD in the opening formed by the separation bank SBNK. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first to third pixels PXL1, PXL2, and PXL3 may include light emitting elements LD emitting light of a same color. For example, the first to third pixels PXL1, PXL2, and PXL3 may include light emitting elements LD emitting light of a third color (or blue). The color conversion layer CCL including color conversion particles is disposed on each of the first to third pixels PXL1, PXL2, and PXL3, so that a full-color image can be displayed.

In an embodiment, the first color conversion layer CCL1 may include first color conversion particles for converting light of the third color, which is emitted from the light emitting element LD, into light of a first color. For example, the first color conversion layer CCL1 may include first quantum dots QD1 dispersed in a matrix material such as base resin.

In an embodiment, in case that the light emitting element LD is a blue light emitting element emitting light of blue, and the first pixel PXL1 is a red pixel, the first color conversion layer CCL1 may include a first quantum dot QD1 for converting light of blue, which is emitted from the blue light emitting element, into light of red. The first quantum dot QD1 may absorb blue light and emit red light by shifting a wavelength of the blue light according to energy transition. In case that the first pixel PXL1 is a pixel of another color, the first color conversion layer CCL1 may include a first quantum dot QD1 corresponding to the color of the first pixel PXL1.

In an embodiment, the second color conversion layer CCL2 may include second color conversion particles for converting light of the third color, which is emitted from the light emitting element LD, into light of a second color. For example, the second color conversion layer CCL2 may include second quantum dots QD2 dispersed in a matrix material such as base resin.

In an embodiment, in case that the light emitting element LD is a blue light emitting element emitting light of blue, and the second pixel PXL2 is a green pixel, the second color conversion layer CCL2 may include a second quantum dot QD2 for converting light of blue, which is emitted from the blue light emitting element, into light of green. The second quantum dot QD2 may absorb blue light and emit green light by shifting a wavelength of the blue light according to energy transition. In case that the second pixel PXL2 is a pixel of another color, the second color conversion layer CCL2 may include a second quantum dot QD2 corresponding to the color of the second pixel PXL2.

In an embodiment, light of blue having a relatively short wavelength in a visible light band is incident into the first quantum dot QD1 and the second quantum dot QD2, so that absorption coefficients of the first quantum dot QD1 and the second quantum dot QD2 can be increased. Accordingly, the efficiency of light finally emitted from the first pixel PXL1 and the second pixel PXL2 can be improved, and excellent color reproducibility can be ensured. The light emitting part EMU of each of the first to third pixels PXL1, PXL2, and PXL3 is configured by using light emitting elements LD of a same color (e.g., blue light emitting elements), so that the manufacturing efficiency of the display device can be improved.

In an embodiment, the light scattering layer LSL may be provided to efficiently use light of the third color (or blue) emitted from the light emitting element LD. In an example, in case that the light emitting element LD is a blue light emitting element emitting light of blue, and the third pixel PXL3 is a blue pixel, the light scattering layer LSL may include at least one kind of light scattering particle SCT to efficiently use light emitted from the light emitting element LD. In an example, the light scattering particle SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). However, the disclosure is not limited thereto. The light scattering particle SCT is not disposed only in the third pixel PXL3, and may be selectively included in the first color conversion layer CCL1 or the second color conversion layer CCL2. In some embodiments, the light scattering particle SCT may be omitted such that the light scattering layer LSL configured with transparent polymer is provided.

In an embodiment, a first capping layer CPL1 may be disposed on the color conversion layer CCL. The first capping layer CPL1 may be provided through the first to third pixels PXL1, PXL2, and PXL3. The first capping layer CPL1 may cover the color conversion layer CCL. The first capping layer CPL1 may prevent the color conversion layer CCL from being damaged or contaminated due to infiltration of an impurity such as moisture or air from the outside.

In an embodiment, the first capping layer CPL1 is an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like. However, the disclosure is not limited thereto.

In an embodiment, the optical layer OPL may be disposed on the first capping layer CPL1. The optical layer OPL may function to improve light extraction efficiency by recycling light provided from the color conversion layer CCL through total reflection. To this end, the optical layer OPL may have a refractive index relatively lower than a refractive index of the color conversion layer CCL. For example, the refractive index of the color conversion layer CCL may be about 1.6 to about 2.0, and the refractive index of the optical layer OPL may be about 1.1 to about 1.3.

In an embodiment, a second capping layer CPL2 may be disposed on the optical layer OPL. The second capping layer CPL2 may be provided throughout the first to third pixels PXL1, PXL2, and PXL3. The second capping layer CPL2 may cover the optical layer OPL. The second capping layer CPL2 may prevent the optical layer OPL from being damaged or contaminated due to infiltration of an impurity such as moisture or air from the outside.

In an embodiment, the second capping layer CPL2 is an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like. However, the disclosure is not limited thereto.

In an embodiment, a planarization layer PLL may be disposed on the second capping layer CPL2. The planarization layer PLL may be provided throughout the first to third pixels PXL1, PXL2, and PXL3.

In an embodiment, the planarization layer PLL may include an organic material such as acrylic resin, epoxy resin, phenolic resin, polyamide resin, polyimide resin, polyester resin (or unsaturated polyester resin), poly-phenylene ether resin, poly-phenylene sulfide resin, or benzocyclobutene (BCB). However, the disclosure is not limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited thereto.

In an embodiment, the color filter layer CFL may be disposed on the planarization layer PLL. The color filter layer CFL may include color filters CF1, CF2, and CF3 which accord with a color of each pixel PXL. The color filters CF1, CF2, and CF3 which accord with a color of each of the first to third pixels PXL1, PXL2, and PXL3 are disposed, so that a full-color image can be displayed.

In an embodiment, the color filter layer CFL may include a first color filter CF1 disposed in the first pixel PXL1 to allow light emitted from the first pixel PXL1 to be selectively transmitted therethrough, a second color filter CF2 disposed in the second pixel PXL2 to allow light emitted from the second pixel PXL2 to be selectively transmitted therethrough, and a third color filter CF3 disposed in the third pixel PXL3 to allow light emitted from the third pixel PXL3 to be selectively transmitted therethrough.

In an embodiment, the first color filter CF1, the second color filter CF2, and the third color filter CF3 may be respectively a red color filter, a green color filter, and a blue color filter, but the disclosure is not limited thereto. Hereinafter, in case that an arbitrary color filter among the first color filter CF1, the second color filter CF2, and the third color filter CF3 is designated or in case that two or more kinds of color filters are inclusively designated, the corresponding color filter or the corresponding color filters are referred to as a "color filter CF" or "color filters CF."

In an embodiment, the first color filter CF1 may overlap the first color conversion layer CCL1 of the first pixel PXL1 in the third direction DR3. The first color filter CF1 may include a color filter material for allowing light of a first color (or red) to be selectively transmitted therethrough. For example, in case that the first pixel PXL1 is a red pixel, the first color filter CF1 may include a red color filter material.

In an embodiment, the second color filter CF2 may overlap the second color conversion layer CCL2 of the second pixel PXL2 in the third direction DR3. The second color filter CF2 may include a color filter material for allowing light of a second color (or green) to be selectively transmitted therethrough. For example, in case that the second pixel PXL2 is a green pixel, the second color filter CF2 may include a green color filter material.

In an embodiment, the third color filter CF3 may overlap the light scattering layer LSL of the third pixel PXL3 in the third direction DR3. The third color filter CF3 may include a color filter material for allowing light of a third color (or blue) to be selectively transmitted therethrough. For example, in case that the third pixel PXL3 is a blue pixel, the third color filter CF3 may include a blue color filter material.

In an embodiment, a light blocking layer BM may be further disposed between the first to third color filters CF1, CF2, and CF3. As described above, in case that the light blocking layer BM is formed between the first to third color filters CF1, CF2, and CF3, a color mixture defect viewed at the front or side of the display device can be prevented. The material of the light blocking layer BM is not particularly limited, and the light blocking layer BM may be configured with various light blocking materials. In an example, the light blocking layer BM may be implemented by stacking the first to third color filters CF1, CF2, and CF3 each other.

In an embodiment, an overcoat layer OC may be disposed on the color filter layer CFL. The overcoat layer OC may be provided throughout the first to third pixels PXL1, PXL2, and PXL3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

In an embodiment, the overcoat layer OC may include an organic material such as acrylic resin, epoxy resin, phenolic resin, polyamide resin, polyimide resin, polyester resin (e.g., unsaturated polyester resin), poly-phenylene ether resin, poly-phenylene sulfide resin, or benzocyclobutene (BCB). However, the disclosure is not limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Figure 11:
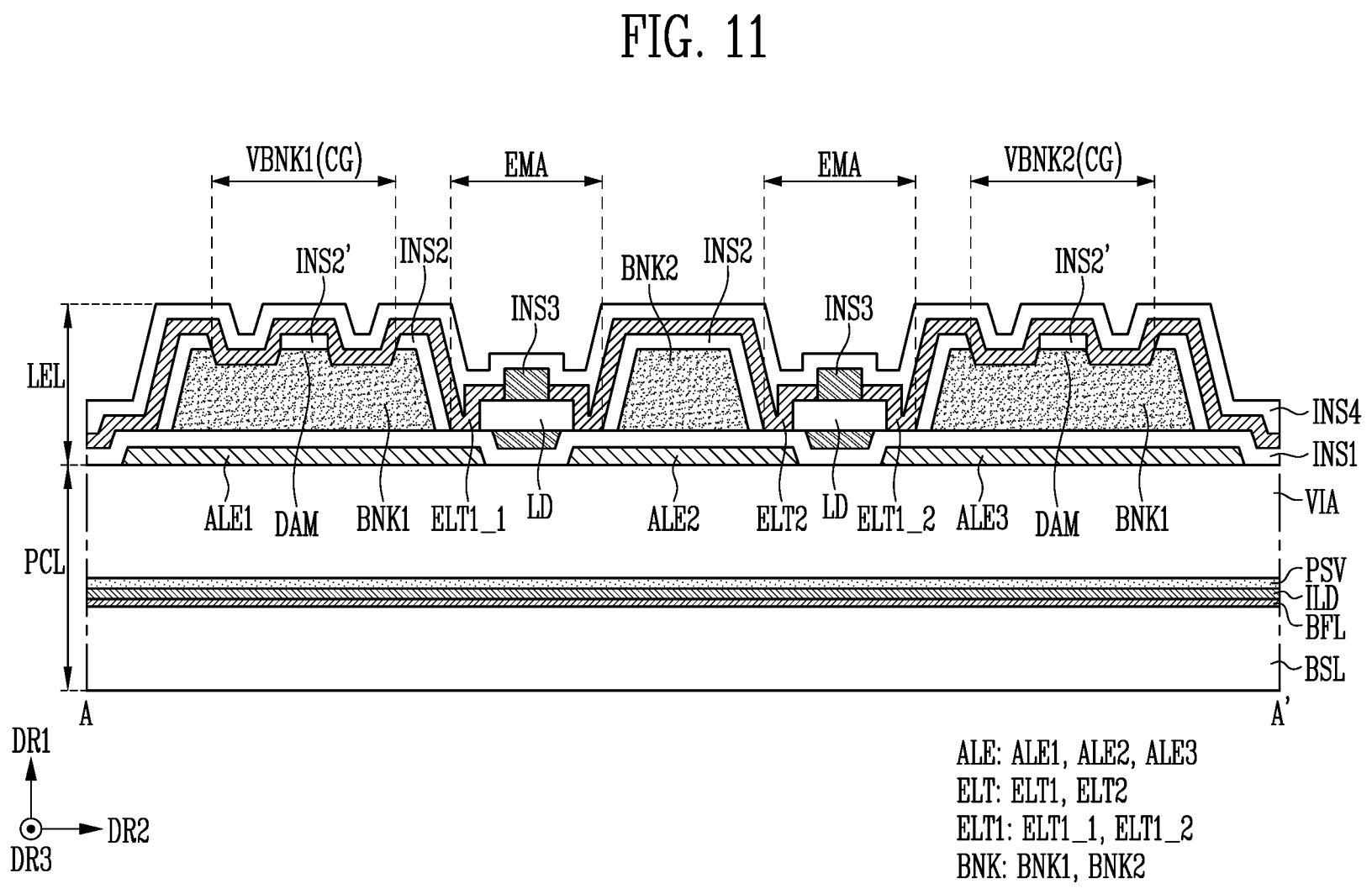

FIG. 11 is a schematic sectional view illustrating another example taken along line A-A' shown in FIG. 5.

In FIG. 11, the other components except an insulating material INS2' disposed on the dam structure DAM are identical to the components shown in FIG. 7. Therefore, components identical or corresponding to the components shown in FIG. 7 are designated by like reference numerals, and overlapping descriptions will be omitted.

Referring to FIG. 11, the insulating material INS2' may be disposed on the dam structure DAM. In an example, the insulating material INS2' may have a single-layer structure or a multi-layer structure. The insulating material INS2' may include an inorganic material. For example, the insulating material INS2' may include at least one selected from the group consisting of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited thereto.

In an embodiment, the insulating material INS2', the first insulating layer INS1, and the second insulating layer INS2 may include a same material.

In an embodiment, as the insulating material INS2' is disposed on the dam structure DAM, the insulating material INS2' covering the dam structure DAM may have a hydrophilic surface characteristic. An area except an upper portion of the dam structure DAM in the concave groove CG may have the hydrophilic surface characteristic.

FIGS. 12 to 17 are schematic sectional views illustrating a method of manufacturing the display device in accordance with embodiments of the disclosure. In FIGS. 12 to 17, descriptions which may overlap those described above, will be simplified or will not be repeated.

Figure 12:
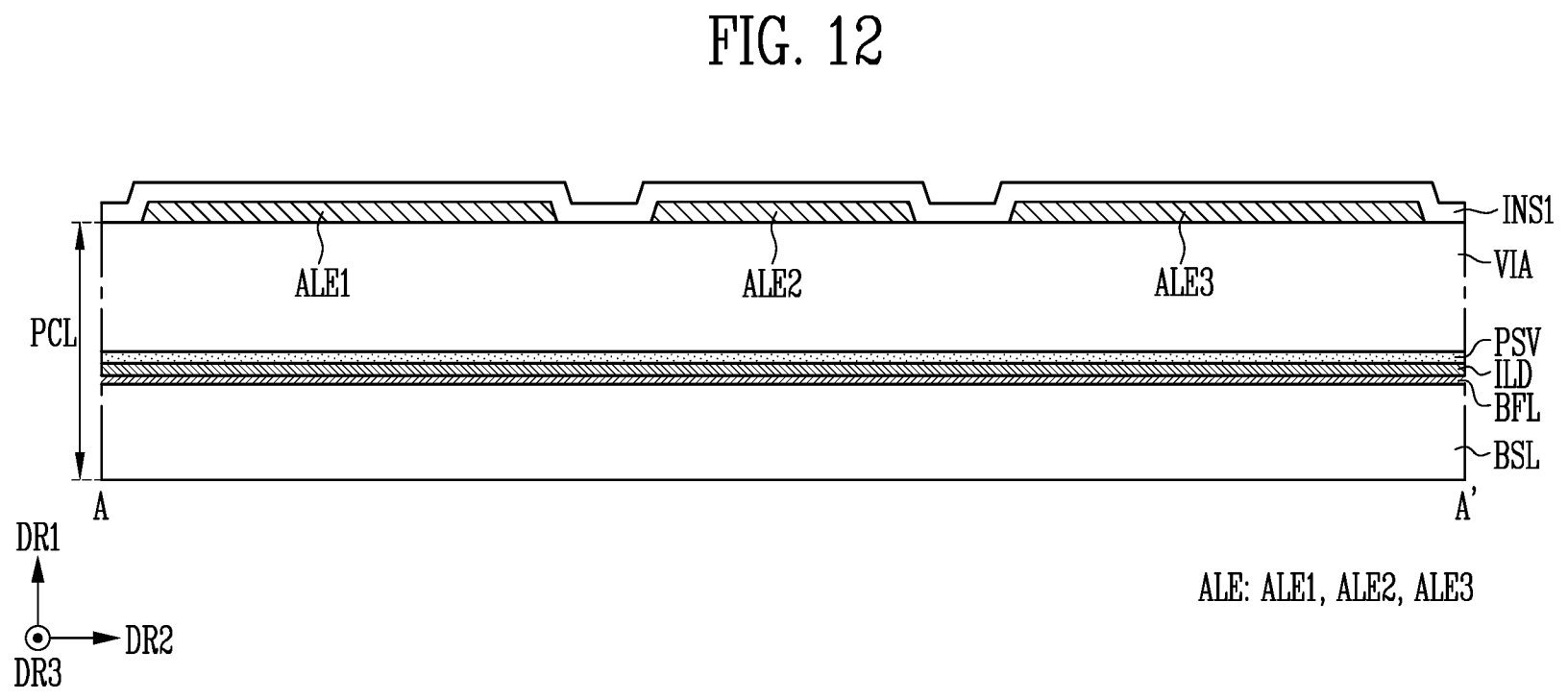

Referring to FIGS. 12, a pixel circuit layer PCL may be formed by disposing a buffer layer BFL, an interlayer insulating layer ILD, a protective layer PSV, and a via layer VIA on a base layer BSL. Although not shown in the drawing, electrodes (or lines) disposed in the pixel circuit layer PCL may be disposed between the insulating layers.

In this phase, individual components (e.g., the electrodes, the lines, the buffer layer BFL, the interlayer insulating layer ILD, the protective layer PSV, and the via layer VIA) of the pixel circuit layer PCL may be formed by patterning a conductive layer (or metal layer), an inorganic material, an organic material, or the like through an ordinary process using a mask.

Referring to FIG. 12, alignment electrodes ALE may be disposed on the pixel circuit layer PCL. A first insulating layer INS1 may be disposed over the alignment electrodes ALE.

In this phase, first to third alignment electrodes ALE1, ALE2, and ALE3 may be patterned on the via layer VIA.

Figure 13:
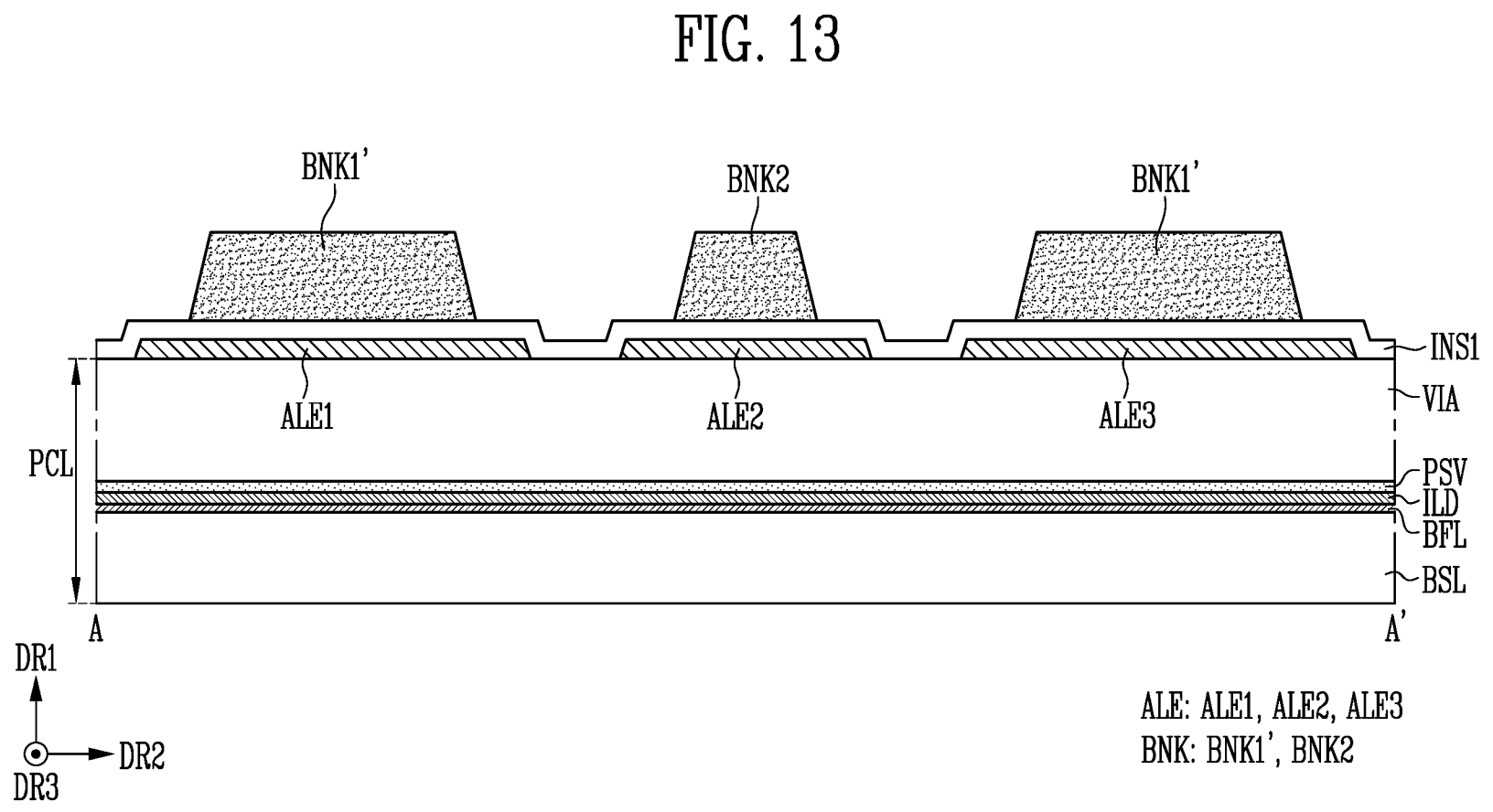

Referring to FIG. 13, a bank BNK may be formed on the first insulating layer INS1. In an example, a first base bank BNK1' and a second bank BNK2 may be formed through patterning using a mask with respect to an organic material including a light blocking material. The first base bank BNK1' may be disposed to overlap the first alignment electrode ALE1 (and/or the third alignment electrode ALE3) in a plan view. The second bank BNK2 may be disposed to overlap the second alignment electrode ALE2 in a plan view.

In an embodiment, the first base bank BNK1' may be a component for forming a first bank BNK1. In case that the first base bank BNK1' is etched as a subsequent process is performed, the first bank BNK1 may be provided.

Figure 14:
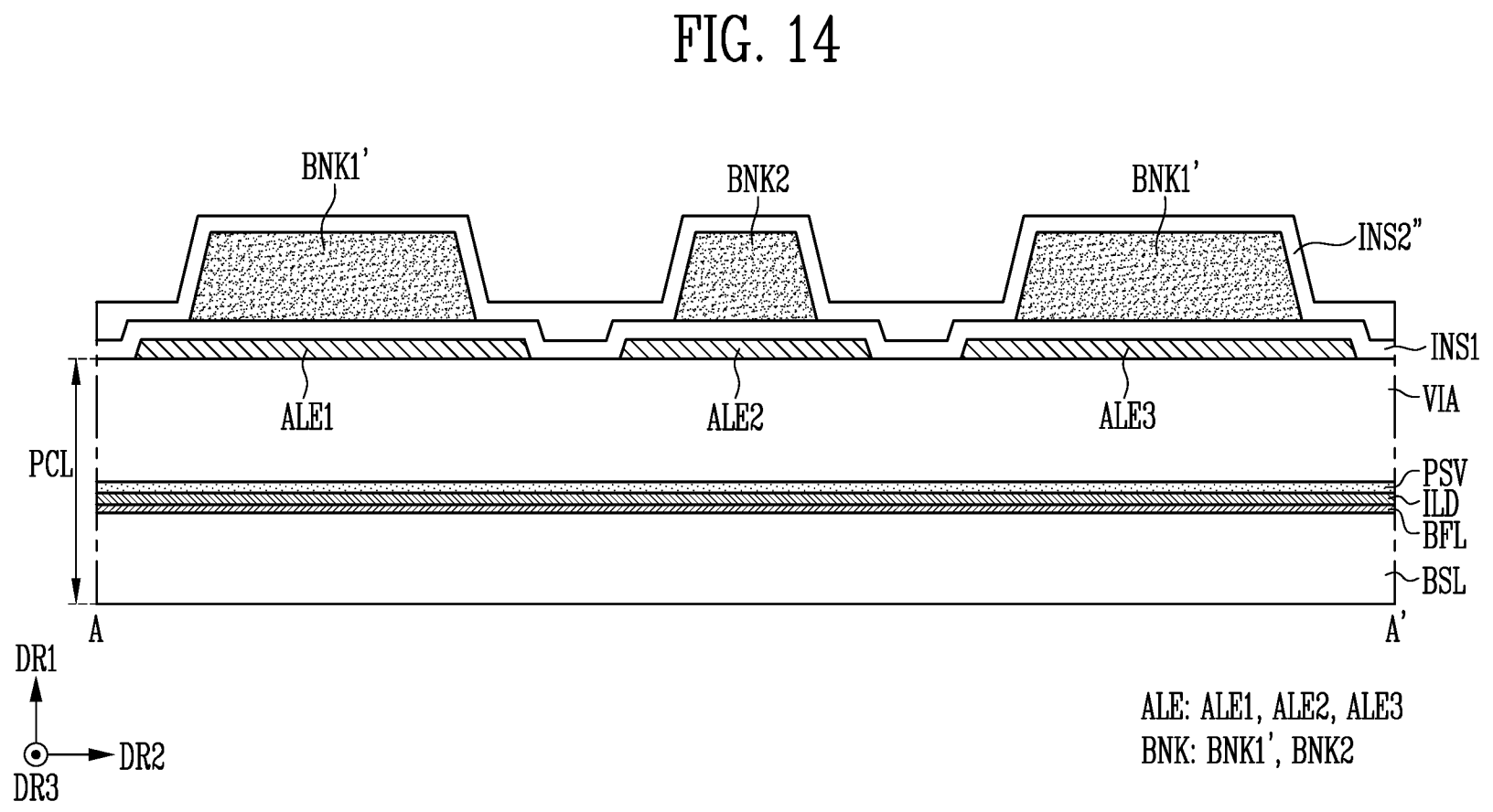

Referring to FIG. 14, a second base insulating layer INS2" may be disposed over the first base bank BNK1' and the second bank BNK2.

In an embodiment, the second base insulating layer INS2" may be a component for forming a second insulating layer INS2. In case that the second base insulating layer INS2" is etched as a subsequent process is performed, the second insulating layer INS2 may be provided.

In some embodiments, the first insulating layer INS1 and the second base insulating layer INS2" may include a same material. In this phase, the first base bank BNK1' and the second bank BNK2 may be entirely covered by the first insulating layer INS1 and the second base insulating layer INS2". Outer surfaces of the first base bank BNK1' and the second bank BNK2 may be covered by insulating layers including a same material.

Figure 15A:
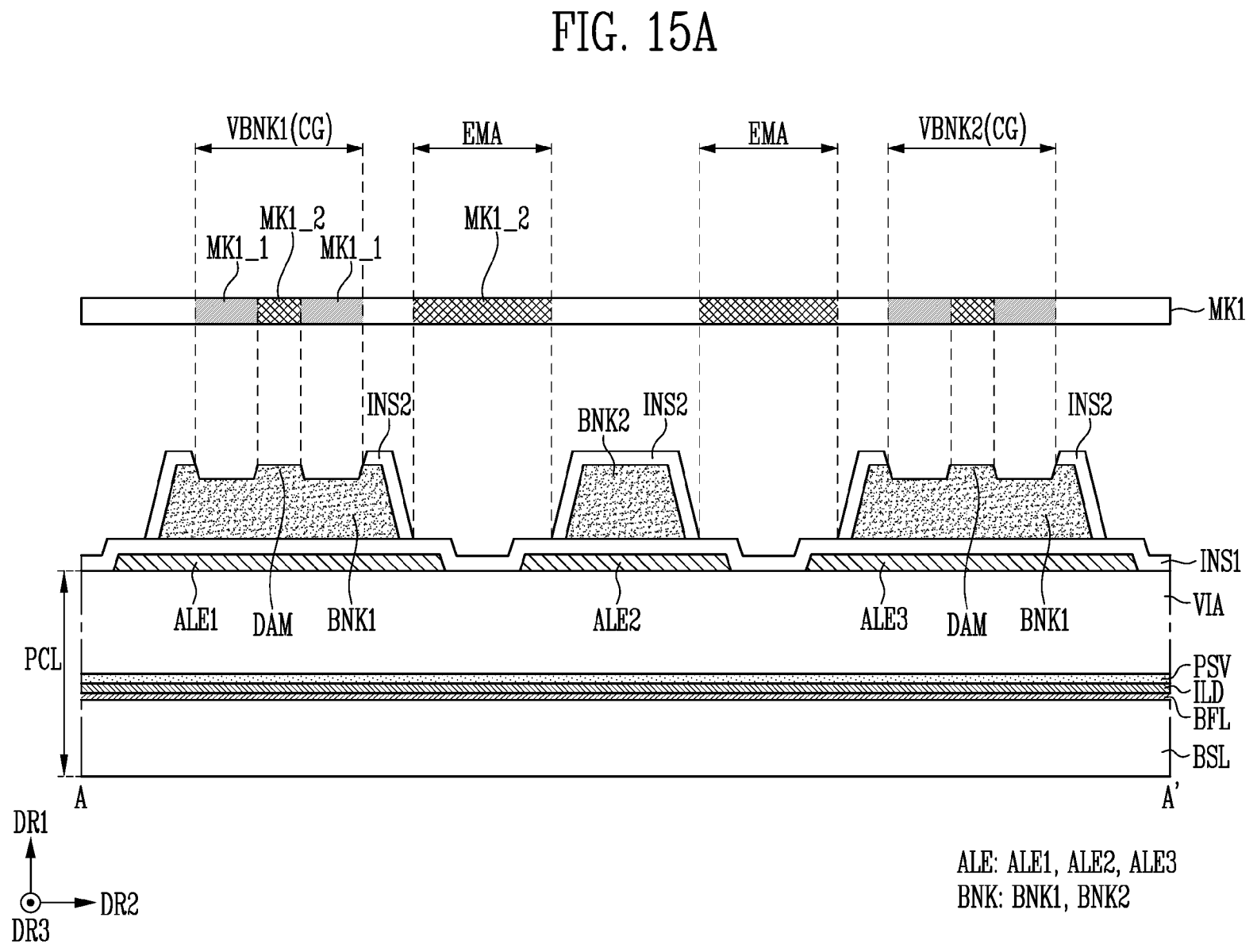
Figure 15B:
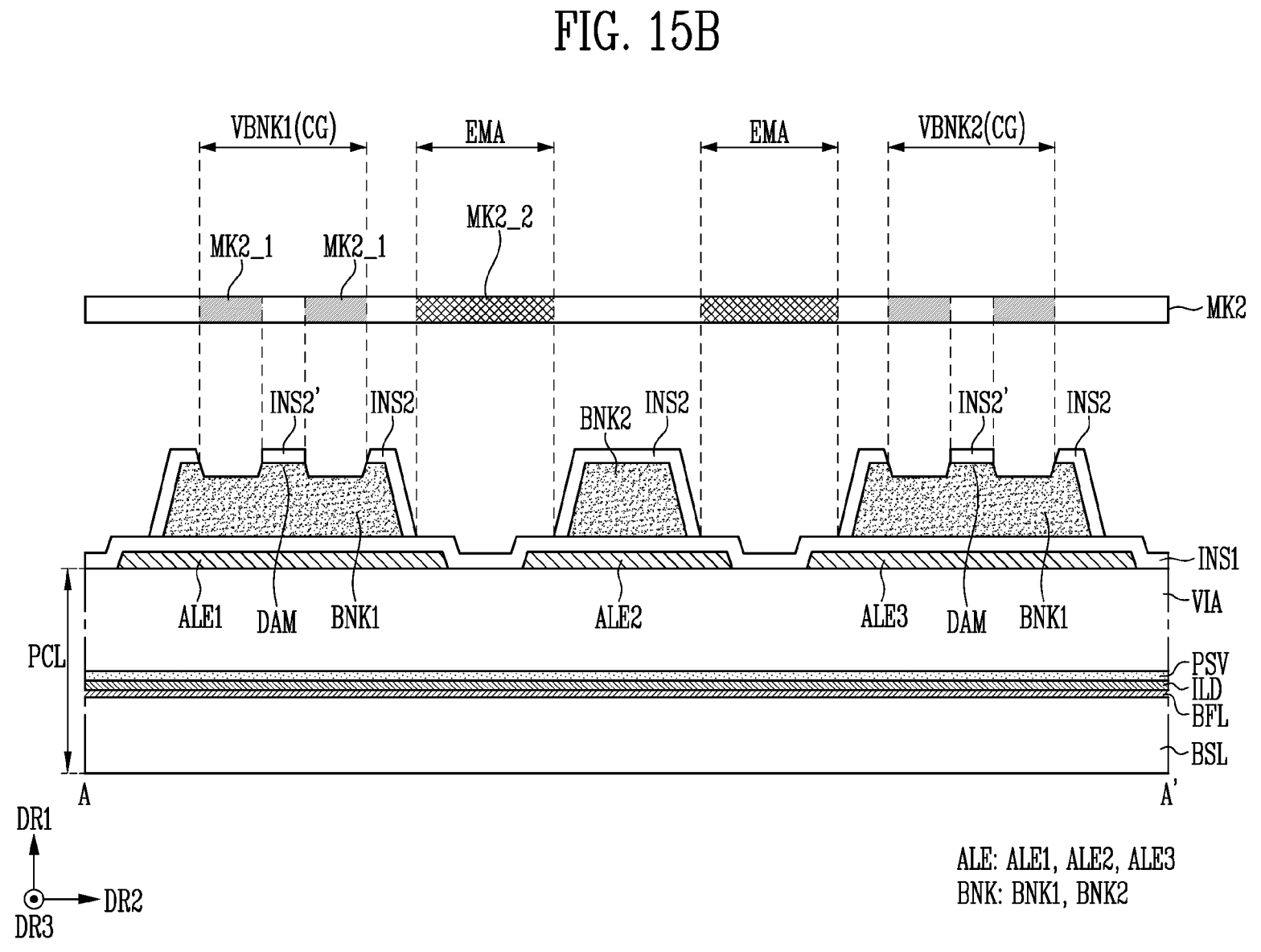

Referring to FIGS. 15A and 15B, at least a portion of each of the first base bank BNK1' and the second base insulating layer INS2" may be removed. The at least a portion of each of the first base bank BNK1' and the second base insulating layer INS2" may be etched. The etching may be wet etching or dry etching, but the disclosure is not limited to a specific example.

In an embodiment, the first base bank BNK1' and the second base insulating layer INS2" may be etched through a single process. At least a portion of each of the first base bank BNK1' and the second base insulating layer INS2" may be removed through an etching process using a same mask.

Referring to FIG. 15A, a first mask MK1 including a first area MK1_1 and a second area MK1_2 may be used in the process of etching the first base bank BNK1' and the second base insulating layer INS2". A light transmittance of the first mask MK1 in the first area MK1_1 may be greater than a light transmittance of the first mask MK1 in the second area MK1_2.

In an embodiment, an area in which light is transmitted in the first mask MK1 may correspond to a concave groove CG of the first bank BNK1 and an emission area EMA.

In an embodiment, in a plan view, the first area MK1_1 of the first mask MK1 may correspond to an area except an area in which a dam structure DAM is disposed in the concave groove CG. In a plan view, the second area MK1_2 of the first mask MK1 may correspond to the area in which the dam structure DAM is disposed and the emission area EMA.

In an embodiment, a first concave groove (e.g., the first concave groove CG1 shown in FIG. 9) and a second concave groove (e.g., the second concave groove CG2 shown in FIG. 9) may be formed in an area corresponding to the first area MK1_1 of the first mask MK1. A dam structure DAM between the first concave groove CG1 and the second concave groove CG2 may be formed in an area corresponding to the second area MK1_2 of the first mask MK1.

In an embodiment, an etching degree may vary for each area due to a light transmittance difference between the first area MK1_1 and the second area MK1_2 of the first mask MK1. In case that this etching process is performed, a portion of the first bask bank BNK1' shown in FIG. 14 and a portion of each second base insulating layer INS2" shown in FIG. 14 may be removed, so that the first bank BNK1 and the second insulating layer INS2 may be provided. In case that the first mask MK1 is used in this etching process, the second base insulating layer INS2" on the dam structure DAM may be etched, so that any insulating material may not be disposed on the dam structure DAM.

In an embodiment, a height of the dam structure of the first bank BNK1 (e.g., the height H1 of the dam structure shown in FIG. 9) may be adjusted by adjusting the light transmittance of the second area MK1_2 of the first mask MK1. For example, a dam structure having a relatively low height may be provided by increasing the light transmittance. In case that the light transmittance is lowered, a dam structure having a relatively high height may be provided.

In case that at least a portion of each of the first base bank BNK1' and the second base insulating layer INS2" is etched by using the first mask MK1, the display device having the pixel structure shown in FIG. 7 may be provided.

Referring to FIG. 15B, a second mask MK2 including a first area MK2_1 and a second area MK2_2 may be used in the process of etching the first base bank BNK1' and the second base insulating layer INS2".

In an embodiment, an area in which light is transmitted in the second mask MK2 may correspond to an area except an area in which the dam structure DAM is disposed in the concave groove CG and the emission area EMA. In an example, the light transmittance in the area of the second mask MK2, which corresponds to the area in which the dam structure DAM is disposed in the concave groove CG, may be about 0.

In an embodiment, in a plan view, the first area MK2_1 of the second mask MK2 may correspond to the area except the area in which the dam structure DAM is disposed in the concave groove CG. In a plan view, the second area MK2_2 of the second mask MK2 may correspond to the emission area EMA. In case that this etching process is performed, a portion of the first bask bank BNK1' shown in FIG. 14 and a portion of each second base insulating layer INS2" shown in FIG. 14 may be removed, so that the first bank BNK1 and the second insulating layer INS2 may be provided. In case that the second mask MK2 is used in this etching process, an insulating material INS2' may be disposed on the dam structure DAM. As the second base insulating layer INS2" on the dam structure DAM is not etched, the insulating material INS2' may be disposed on the dam structure DAM.

In case that at least a portion of each of the first base bank BNK1' and the second base insulating layer INS2" is etched by using the second mask MK2, the display device having the pixel structure shown in FIG. 11 may be provided.

Figure 16:
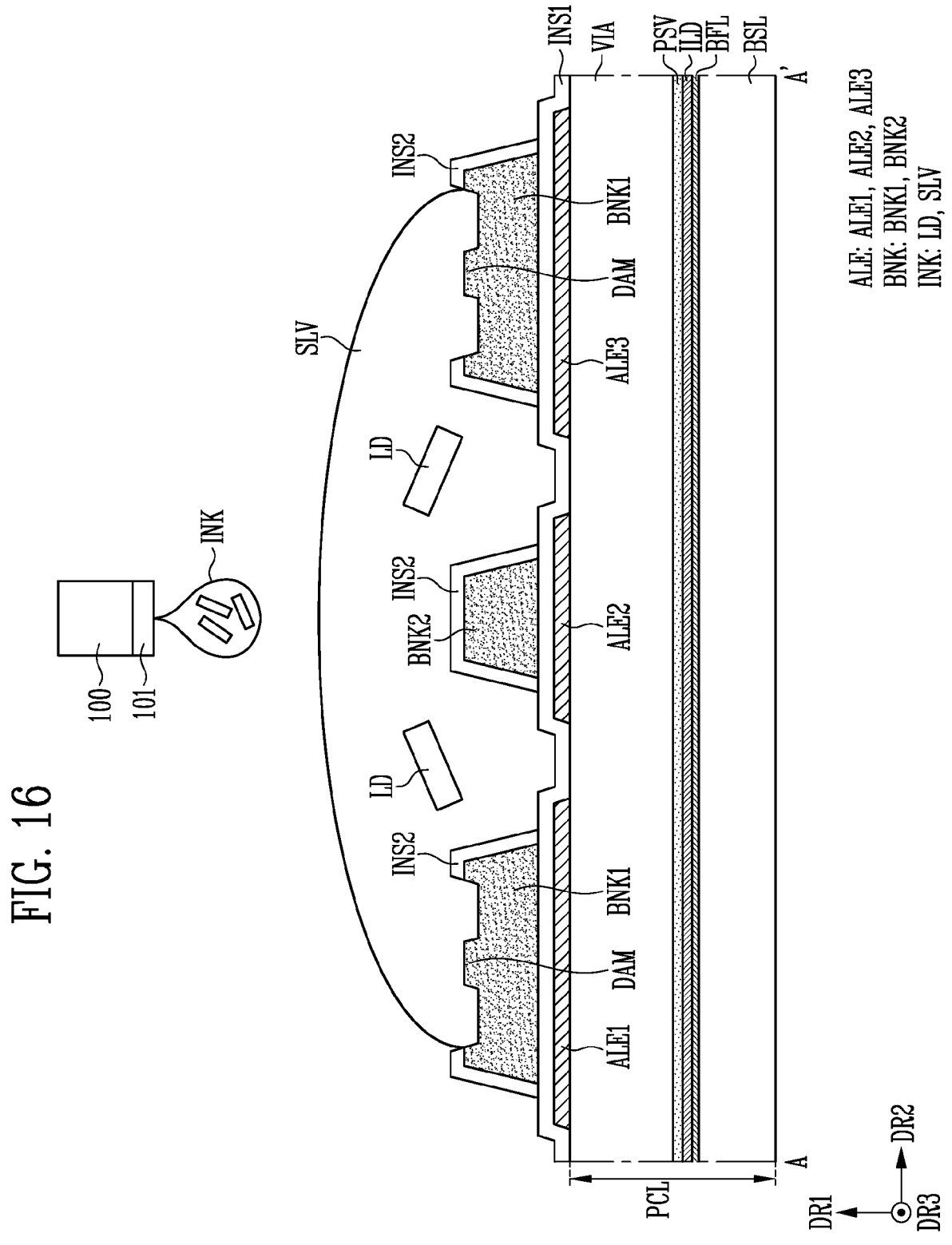
Figure 17:
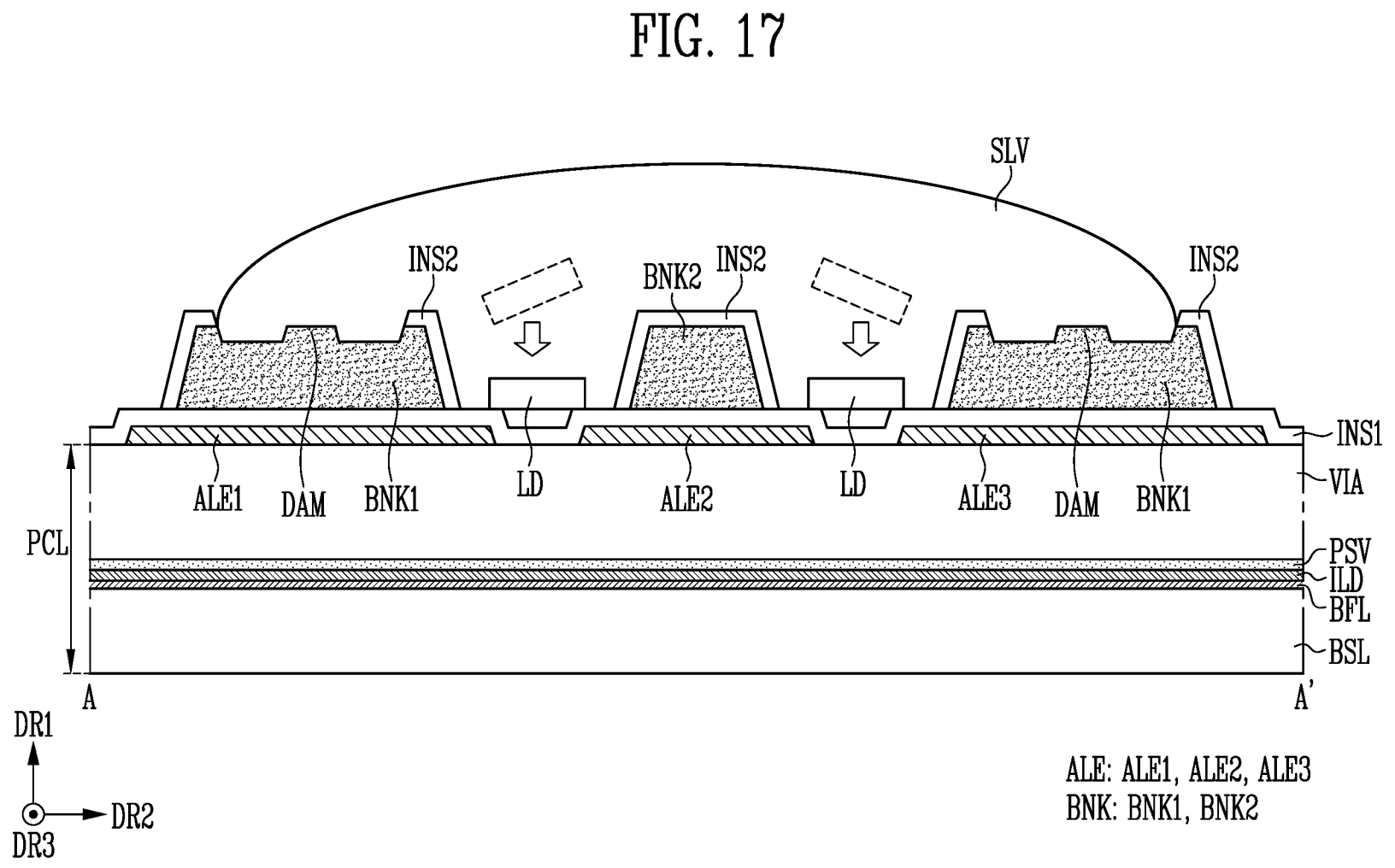

Although it is illustrated that FIGS. 16 and 17 correspond to a subsequent manufacturing process with respect to FIG. 15A, FIGS. 16 and 17 may also be identically applied to a subsequent manufacturing process with respect to FIG. 15B.

Referring to FIG. 16, a surface treatment process may be performed on the bank BNK and the second insulating layer INS2, and the ink INK may be supplied (or sprayed) onto the base layer BSL (or the first insulating layer INS1). The ink INK may be provided by a printing apparatus 100 capable of spraying a fluid.

In an embodiment, the printing apparatus 100 may include a nozzle device 101 configured to discharge a liquid fluid to the outside. The ink INK defined in this specification may mean a liquid mixture capable of being discharged by the printing apparatus 100. The printing apparatus 100 may spray the ink INK while moving above an area in which light emitting elements LD are to be arranged.

In an embodiment, the ink INK may include a solvent SLV and a light emitting element LD. The light emitting element LD may be provided in plurality, to be dispersed and provided in the solvent SLV having fluidity. For example, in some embodiments, the solvent SLV may have fluidity, and accordingly, the light emitting elements LD may be dispersed in the solvent SLV. The solvent SLV may mean a liquid-phase material, instead of a solid-phase material, in which the light emitting elements LD are dispersed and provided. In some embodiments, the solvent SLV may include an organic solvent. For example, the solvent SLV may be one of Propylene Glycol Methyl Ether Acetate (PGMEA), Dipropylene Glycol n-Propyl Ether (DGPE), and triethylene Glycol n-Butyl Ether (TGBE). However, the disclosure is not limited to the above-described example, and the solvent SLV may include various organic solvents.

In this phase, the ink INK may be accommodated in a space defined by the bank BNK. The light emitting elements LD included in the ink INK may be provided in a state in which the light emitting elements LD are randomly located in the space.

In an embodiment, the surface treatment process performed on the bank BNK and the second insulating layer INS2 may be a plasma surface treatment process. Various manners may be applied to the plasma surface treatment process. For example, a radio frequency (RF) power source, a medium frequency (MF) power source, a direct current (DC) power source, a microwave (MW) power source, or the like may be used as a power source for plasma surface treatment. However, the disclosure is not limited to a specific example. In some embodiments, in case that the surface treatment process is performed, surface energy of the first bank BNK1 including an organic material may be changed, to have a hydrophobic property, and surface energy of the second insulating layer INS2 including an inorganic material may not be relatively changed. Accordingly, the concave groove CG of the first bank BNK1 may have a hydrophobic surface characteristic, and the second insulating layer INS2 (and the insulating material INS2' shown in FIG. 11) may have a hydrophilic surface characteristic.

In an embodiment, a measurement of capacity with which the ink INK including the light emitting elements LD may be accommodated may be secured by the dam structure DAM in the concave groove CG of the first bank BNK1, and the light emitting elements LD in the ink INK may be uniformly disposed in the emission area EMA defined by the first bank BNK1 and the second bank BNK2.

In an embodiment, the light emitting elements LD included in the ink INK may be guided to be disposed in the emission area EMA in which the first insulating layer INS1 having a hydrophilic surface characteristic is disposed.

In an embodiment, as the concave groove CG of the first bank BNK1 has the hydrophobic surface characteristic, the ink INK including the light emitting elements LD may have a tendency not to be relatively disposed on a surface of the concave groove CG of the first bank BNK1, and have a tendency to be disposed in the emission area EMA in which the first insulating layer INS1 having the hydrophilic surface characteristic is disposed, so that the light emitting elements LD may be uniformly disposed.

Referring to FIG. 17, the light emitting elements LD may be aligned on the alignment electrodes ALE. The light emitting elements LD may be disposed on the first insulating layer INS1 between the banks BNK.

In this phase, the alignment electrodes ALE may form an electric field. An electrical signal (e.g., an alignment signal) may be provided to the alignment electrodes ALE, so that an electric field may be formed in an area in which the light emitting elements LD are to be aligned. For example, a first alignment signal may be provided to the first alignment electrode ALE1, a second alignment signal may be provided to the second alignment electrode ALE2, and an electric field based on the first alignment signal and the second alignment signal may be formed in an area in which light emitting elements LD are to be aligned between the first bank BNK1 and the second bank BNK2. A first alignment signal may be provided to the third alignment electrode ALE3, a second alignment signal may be provided to the second alignment electrode ALE2, and an electric filed based on the first alignment signal and the second alignment signal may be formed in an area in which light emitting elements LD are to be aligned between another first bank BNK1 and another second bank BNK2.

In an embodiment, the light emitting element LD may be moved (or rotated) by a force (e.g., a dielectrophoresis (DEP) force) according to the electric field, to be aligned (or disposed) on the first insulating layer INS1. For example, the moved light emitting elements LD may be aligned on the alignment electrodes ALE.

In an embodiment, the electrical signal (e.g., the alignment signal) provided to the alignment electrodes ALE may include an AC signal. For example, the first alignment signal may be an AC signal, and the second alignment signal may be a ground signal. As another example, the first alignment signal may be a ground signal, and the second alignment signal may be an AC signal. However, the disclosure is not limited to the above-described example. The AC signal may be at least one of a sine wave, a triangular wave, a step voltage, a square wave, a trapezoidal wave, and a pulse wave. However, the disclosure is not limited thereto, and the AC signal may have various AC signal forms.

In an embodiment, after the process shown in FIG. 17, a third insulating layer INS3, a first connection electrode ELT1, and a second connection electrode ELT2 may be formed as shown in FIG. 7. The third insulating layer INS3 may be formed to overlap at least a portion (e.g., an active layer 12) of the light emitting element LD, and a portion of the third insulating layer INS3 may be provided on a rear surface of the light emitting element LD.

Subsequently, in some embodiments, a fourth insulating layer INS4, a color conversion layer CCL, an optical layer OPL, a color filter layer CFL, and the like may be formed, thereby providing the display device DD in accordance with the embodiment of the disclosure.

In the display device and the method of manufacturing the same in accordance with the disclosure, a capacity with which an ink including light emitting elements may be accommodated can be secured by a concave groove of a bank. The light emitting elements and the ink including the same may be prevented from overflowing to an emission area of an adjacent pixel by a dam structure formed in the concave groove, so that light emitting elements may not be biasedly disposed in an emission area of a pixel. Thus, light emitting elements can be uniformly disposed for each of emission areas of pixels.

Further, light emitting elements included in an ink including an organic solvent can be guided to be disposed on an insulating layer having a hydrophilic surface characteristic.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a first electrode and a second electrode disposed on a substrate;

a first insulating layer disposed over the first electrode and the second electrode;

a first bank and a second bank disposed on the first insulating layer and spaced apart from each other;

a second insulating layer on an outer sidewall of the first bank; and a light emitting element disposed between the first bank and the second bank, wherein a top surface of the first bank includes a concave groove including a dam structure protruding in a first direction, and wherein a surface of the concave groove is exposed from the second insulating layer.

2. The display device of claim 1, wherein the second insulating layer is disposed on an outer sidewall of the second bank.

3. The display device of claim 2, wherein an insulating material is disposed on a top surface of the dam structure.

4. The display device of claim 3, wherein the insulating material and the second insulating layer include a same material.

5. The display device of claim 2, wherein the dam structure is disposed on a flat surface surrounded by an inner sidewall of the concave groove of the first bank.

6. The display device of claim 5, wherein a height of the dam structure from the flat surface is equal to or smaller than a depth of the concave groove.

7. The display device of claim 5, wherein the flat surface of the concave groove includes a first concave groove and a second concave groove, the first concave groove and the second concave groove are spaced apart from each other in a second direction with the dam structure disposed between the first and second concave grooves, and a width of each of the first concave groove and the second concave groove in the second direction is longer than a width of the dam structure in the second direction.

8. The display device of claim 7, wherein a width of the first bank in the second direction is longer than a width of the second bank in the second direction.

9. The display device of claim 1, wherein the second bank is disposed between the first bank and an adjacent first bank.

10. An electronic device comprising:

a first electrode and a second electrode disposed on a substrate;

a first insulating layer disposed over the first electrode and the second electrode;

a first bank and a second bank disposed on the first insulating layer and spaced apart from each other;

a second insulating layer disposed on an outer sidewall of the first bank and the second bank; and a light emitting element disposed between the first bank and the second bank, wherein a top surface of the first bank includes a concave groove including a dam structure protruding in a first direction, and wherein, in a plan view, the concave groove and the second insulating layer do not overlap each other.

11. A display device comprising:

a first electrode and a second electrode disposed on a substrate;

a first insulating layer disposed over the first electrode and the second electrode;

a first bank and a second bank disposed on the first insulating layer and spaced apart from each other;

a second insulating layer disposed on an outer sidewall of the first bank and the second bank; and a light emitting element disposed between the first bank and the second bank, wherein a top surface of the first bank includes a concave groove including a dam structure protruding in a first direction, wherein an insulating material is disposed on a top surface of the dam structure, wherein the insulating material and the second insulating layer include a same material, wherein the insulating material and the second insulating layer have a hydrophilic surface characteristic, and wherein the concave groove of the first bank has a hydrophobic surface characteristic.

* * * * *